(12) United States Patent
Takayama et al.

(10) Patent No.: US 8,467,217 B2
(45) Date of Patent: Jun. 18, 2013

(54) SEMICONDUCTOR DEVICE

(75) Inventors: Shinichi Takayama, Tokyo (JP);
Kazuhiko Kajigaya, Tokyo (JP); Akira Kotabe, Tokyo (JP); Satoru Akiyama, Tokyo (JP); Tomonori Sekiguchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 135 days.

(21) Appl. No.: 12/929,896

(22) Filed: Feb. 23, 2011

(65) Prior Publication Data

US 2011/0205820 A1    Aug. 25, 2011

(30) Foreign Application Priority Data

Feb. 25, 2010   (JP) ................................. 2010-041091

(51) Int. Cl.
  *G11C 5/06*   (2006.01)
  *G11C 7/00*   (2006.01)
  *G11C 8/00*   (2006.01)

(52) U.S. Cl.
  USPC .................... 365/63; 365/205; 365/230.03

(58) Field of Classification Search
  USPC .................... 365/63, 200, 203, 205, 207, 208, 365/230.03, 230.06
  See application file for complete search history.

(56) References Cited

U.S. PATENT DOCUMENTS

| | | | |
|---|---|---|---|
| 5,650,975 A * | 7/1997 | Hamade et al. .......... 365/230.06 |
| 5,764,562 A | 6/1998 | Hamamoto | |
| 5,966,340 A * | 10/1999 | Fujino et al. ............. 365/230.03 |
| 6,157,588 A * | 12/2000 | Matsumoto et al. ............ 365/63 |
| 6,163,493 A * | 12/2000 | Yamagata et al. ....... 365/230.06 |
| 6,259,641 B1 | 7/2001 | Manyoki et al. | |
| 6,404,695 B1 | 6/2002 | Fujino et al. | |
| 6,894,940 B2 * | 5/2005 | Kono et al. .............. 365/230.06 |
| 6,930,939 B2 * | 8/2005 | Lim et al. ....................... 365/205 |
| 6,956,780 B2 * | 10/2005 | Kyung .......................... 365/205 |
| 7,006,391 B2 * | 2/2006 | Hidaka .......................... 365/200 |
| 7,180,817 B2 | 2/2007 | Mochida | |
| 7,333,387 B2 * | 2/2008 | Hwang ............................ 365/63 |
| 8,295,113 B2 * | 10/2012 | Nakaoka ....................... 365/207 |

FOREIGN PATENT DOCUMENTS

| | | |
|---|---|---|
| JP | 08-279290 | 10/1996 |
| JP | 11-306755 | 11/1999 |
| JP | 2000-322883 | 11/2000 |
| JP | 2000-331474 | 11/2000 |
| JP | 2002-230968 | 8/2002 |
| JP | 2006-134469 | 5/2006 |

* cited by examiner

*Primary Examiner* — Trong Phan
(74) *Attorney, Agent, or Firm* — McGinn IP Law Group, PLLC

(57) ABSTRACT

The semiconductor device comprises first and second memory cells, first and second bit lines connected to the first/second memory cells, first and second amplifiers connected to the second bit line, a local input/output line commonly connected to the first/second amplifiers, first and second local column switches connected between the first/second amplifiers and the local input/output line, a second local column switch connected between the second amplifier and the local input/output line, a column select line, a first global column switch connected between the column select line and the first local column switch and controlling a connection therebetween in response to a first select signal, and a second global column switch connected between the column select line and the second local column switch and controlling a connection therebetween in response to a first select signal.

10 Claims, 32 Drawing Sheets

FIG. 24

| WIRING LAYER (OVER THE MEMORY ARRAY) | HIERARCHICAL BIT LINES | NON-HIERARCHICAL BIT LINES |
|---|---|---|
| M0 | BIT LINE (BL) | LOCAL BIT LINE (LBL) |
| M1 | MAIN WORD LINE (MWLB) | GLOBAL BIT LINE (GBL) |
| M2 | COLUMN SELECT LINE (YS) | MAIN WORD LINE (MWLB) |
| M3 | POWER SUPPLY LINE (PL) | COLUMN SELECT LINE (YS) POWER SUPPLY LINE (PL) |

SEMICONDUCTOR DEVICE

BACKGROUND OF THE INVENTION

1. Field of the Invention

The present invention relates to a semiconductor device configured to control a connection between a sense amplifier connected to a bit line and an input/output line using a column select line.

2. Description of Related Art

In general, a semiconductor memory such as a DRAM is provided with sense amplifiers that sense and amplify signals read out from selected memory cells through bit lines and is configured to transfer output signals from the sense amplifiers through hierarchical input/output lines. In the semiconductor memory, control is usually performed so as to select a sense amplifier from a plurality of sense amplifiers based on a column select signal supplied to a column select line and to connect the selected sense amplifier to an input/output line. However, it is required to arrange one column select line for each several sense amplifiers, and therefore this causes an increase in the number of column select lines with an increase in capacity of the semiconductor memory. As measures against this, a method has been proposed in which lines of select signals are arranged separately from the column select lines and the sense amplifier is selected based on the column select lines and the lines of select signals (for example, refer to Patent References 1 to 6). For example, FIG. 7 of Patent Reference 5 discloses a configuration in which connection of sense amplifiers (SA0 to SA3) to a common IO line (e.g., IO0) is switched by using column select signals (YS0 and YS1) and column bank select signal lines (CBS0 and CBS1). Also, for example, FIG. 2 of Patent Reference 6 discloses a configuration in which one global column select switch (10) is arranged between one column select line (7) and four local column select switches (20).

[Patent Reference 1] Japanese Patent Application Laid-open No. 2000-322883

[Patent Reference 2] Japanese Patent Application Laid-open No. H8-279290 (U.S. Pat. No. 5,764,562)

[Patent Reference 3] Japanese Patent Application Laid-open No. 2000-331474 (U.S. Pat. No. 6,259,641)

[Patent Reference 4] Japanese Patent Application Laid-open No. 2002-230968 (U.S. Pat. No. 6,404,695)

[Patent Reference 5] Japanese Patent Application Laid-open No. H11-306755

[Patent Reference 6] Japanese Patent Application Laid-open No. 2006-134469 (U.S. Pat. No. 7,180,817)

In semiconductor memory devices of recent years such as a DRAM, miniaturization of elements such as wiring lines has been developed from viewpoints of a reduction in chip area and a reduction in power consumption. However, if linewidths are reduced due to the miniaturization, wiring resistance thereof becomes large. For example, if the wiring resistance of a power supply line becomes large, the potential of a supply voltage supplied to elements of the semiconductor memory through the power supply line falls. In the semiconductor memory, for example, power supply lines supplied to amplifiers such as sense amplifiers are generally arranged over a memory array including a plurality of memory cells, and therefore if the potential of the supply voltage supplied through the power supply lines falls, an operation of the semiconductor memory becomes unstable. In order to suppress the reduction of the supply voltage, the resistance of the power supply lines needs to be reduced by increasing the number of power supply lines. However, the number of wiring lines that can be arranged in a wiring layer of a general semiconductor memory is physically restricted by an area of the wiring layer. Accordingly, in order to increase the number of power supply lines, as described above, it is required that a new wiring layer is added or that the number of other lines (e.g., signal lines) arranged in the same wiring layer as for the power supply lines is reduced. Even if the number of power supply lines is increased by adding the wiring layer, there is a problem that manufacturing cost of the semiconductor memory increases.

The configuration disclosed in Patent Reference 5 (FIG. 7 of the Patent Reference 5) is capable of reducing the number of column select lines in comparison with the conventional configuration shown in the Patent Reference 5 (FIG. 8 of the Patent Reference 5), and thus the number of power supply lines arranged in the same layer as for the column select lines can be reduced. However, the configuration disclosed in the Patent Reference 5 requires at least two transistors (SY and SC) between the sense amplifier (SA) and the input/output line (IO), and therefore there is a problem that the operating speed of the semiconductor memory is reduced.

Meanwhile, the configuration disclosed in Patent Reference 2 that enables speeding-up the column select operation is not capable of reducing the number of column select lines, and thus the above problem of the reduction of the supply voltage has not been solved.

SUMMARY

The present invention seeks to solve one or more of the above problems, or to improve upon those problems at least in part.

One of aspects of the invention is a semiconductor device comprising: first and second memory cells; a first bit line connected to the first memory cell; a second bit line connected to the second memory cell; a first amplifier connected to the first bit line; a second amplifier connected to the second bit line; a local input/output line commonly connected to the first and second amplifiers; a first local column switch connected between the first amplifier and the local input/output line; a second local column switch connected between the second amplifier and the local input/output line; a column select line; a first global column switch connected between the column select line and the first local column switch, the first global column switch controlling a connection between the column select line and the first local column switch in response to a first select signal; and a second global column switch connected between the column select line and the second local column switch, the second global column switch controlling a connection between the column select line and the second local column switch in response to a first select signal.

According to the semiconductor device of the invention, when selecting an amplifier (sense amplifier) connected to a bit line transmitting data of a selected memory cell, the amplifier is selected from two amplifiers corresponding to one column select line by using the first and second select signals and the amplifier is controlled to be connected to a corresponding local input/output line. Thus, the number of column select lines to be arranged can be reduced to half in comparison with a case where the first and second select signals are not used. Since the first and second global switches may be provided as circuits performing the control corresponding to the first and second select signals, a high-speed column select operation can be achieved with a simple circuit configuration. Further, by reducing an area for arranging the column select lines, an area for arranging power supply lines can be increased.

Another aspect of the invention is a semiconductor device comprising: A semiconductor device comprising: first and second memory cells; a first bit line connected to the first memory cell; a second bit line connected to the second memory cell; a first amplifier connected to the first bit line; a second amplifier connected to the second bit line; a common node commonly connected to the first and second amplifiers; a first local column switch connected between the first amplifier and the common node, the first local column switch controlling a connection between the first amplifier and the common node in response to a first select signal; a second local column switch connected between the second amplifier and the common node, the second local column switch controlling a connection between the second amplifier and the common node in response to a second select signal; a local input/output line; a column select line; and a global column switch controlling a connection between the common node and the local input/output line in response to the column select line.

As described above, according to the present invention, the semiconductor device is configured in which the first and second amplifier can be selectively connected to the local input/output line by using the column select lines and the first and second select signals, and thus the number of column select lines corresponding to the number of amplifiers can be reduced with a small circuit scale and a high-speed operation. Further, reducing the number of column select lines allows the power supply lines to be arranged in an empty space on a wiring layer so that that the empty space can be effectively utilized, and influence of power supply noise can be suppressed.

BRIEF DESCRIPTION OF THE DRAWINGS

The above featured and advantages of the present invention will be more apparent from the following description of certain preferred embodiments taken in conjunction with the accompanying drawings, in which:

FIG. 24 is a diagram showing an example of a general assignment in which respective lines are assigned to wiring layers in relation to a hierarchical bit line structure and a non-hierarchical bit line structure;

DETAILED DESCRIPTION OF THE PREFERRED EMBODIMENTS

Preferred embodiments of the invention will be described in detail below with reference to accompanying drawings. In the following embodiments, the present invention is applied to a DRAM (Dynamic Random Access Memory) as an example of a semiconductor device.

[First Embodiment]

Figure 1:
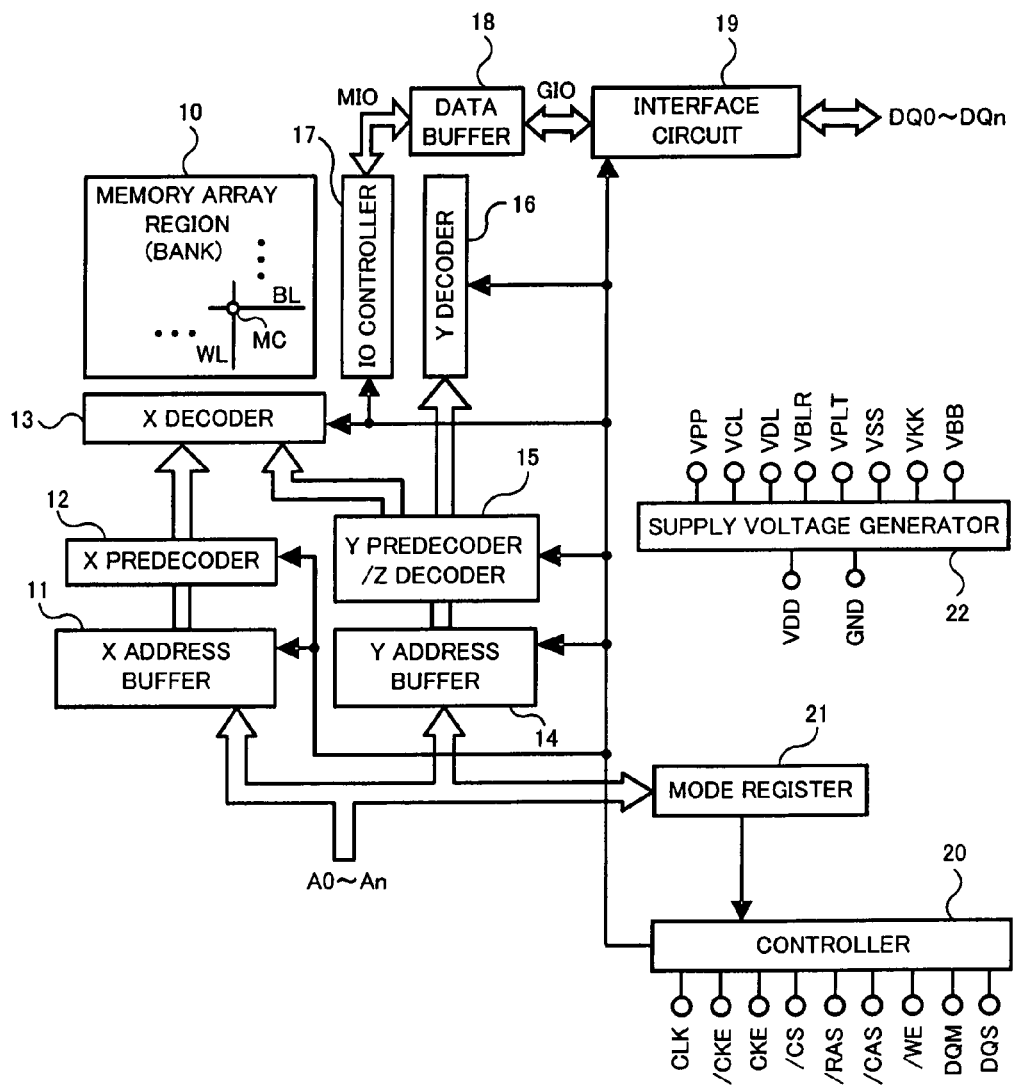
FIG. 1 is a functional block diagram of an entire DRAM of a first embodiment.

In the first embodiment, the invention is applied to the DRAM in which only a bit line structure is hierarchized (simple hierarchical bit line array). First, FIG. 1 is a functional block diagram of the entire DRAM of the first embodiment. The DRAM shown in FIG. 1 has a memory array region 10 partitioned into a plurality of banks (BANK). A specific configuration of the memory array region 10 will be described later. The DRAM receives an X address and a Y address in time division from address input terminals (A0, A1, ... and An). The X address received from the address input terminals is stored in an X address buffer 11 and subsequently is sent to an X decoder 13 via an X predecoder 12. Thereafter, the Y address received from the address input terminals is stored in a Y address buffer 14 and subsequently is sent to the X decoder 13 and a Y decoder 16 via a Y predecoder/Z decoder 15.

In each bank of the memory array region 10, a plurality of memory cells MC are formed at intersections of a plurality of word lines WL and a plurality of bit lines BL. The X decoder 13 is arranged at one end in a word line extending direction of the memory array region 10, and the IO controller 17 and the Y decoder 16 are arranged at one end in a bit line extending direction of the memory array region 10. In the memory array region 10, it is possible to access a memory cell MC at an intersection of a word line WL selected by the X decoder 13 and a bit line BL selected by the Y decoder 16. Data transfer can be performed between an IO controller 17 and externally connectable data terminals DQ0 to DQn through a main input/output line MIO, a data buffer 18, a global input/output line GIO and an interface circuit 19.

A controller 20 generates various control signals and internal clocks based on control/clock signals (CLK, /CKE, CKE, /CS, /RAS, /CAS, /WE, DQM and DQS) and supplies them to various parts of the DRAM. Further, a mode register 21 selectively sets operation modes of the DRAM based on the above addresses and sends setting information to the controller 20. A supply voltage generator 22 generates supply voltages (VPP, VCL, VDL, VBLR, VPLT, VSS, VKK and VBB) supplied to internal circuits of the DRAM using a supply voltage VDD and a ground potential GND that are supplied from outside.

Figure 2:
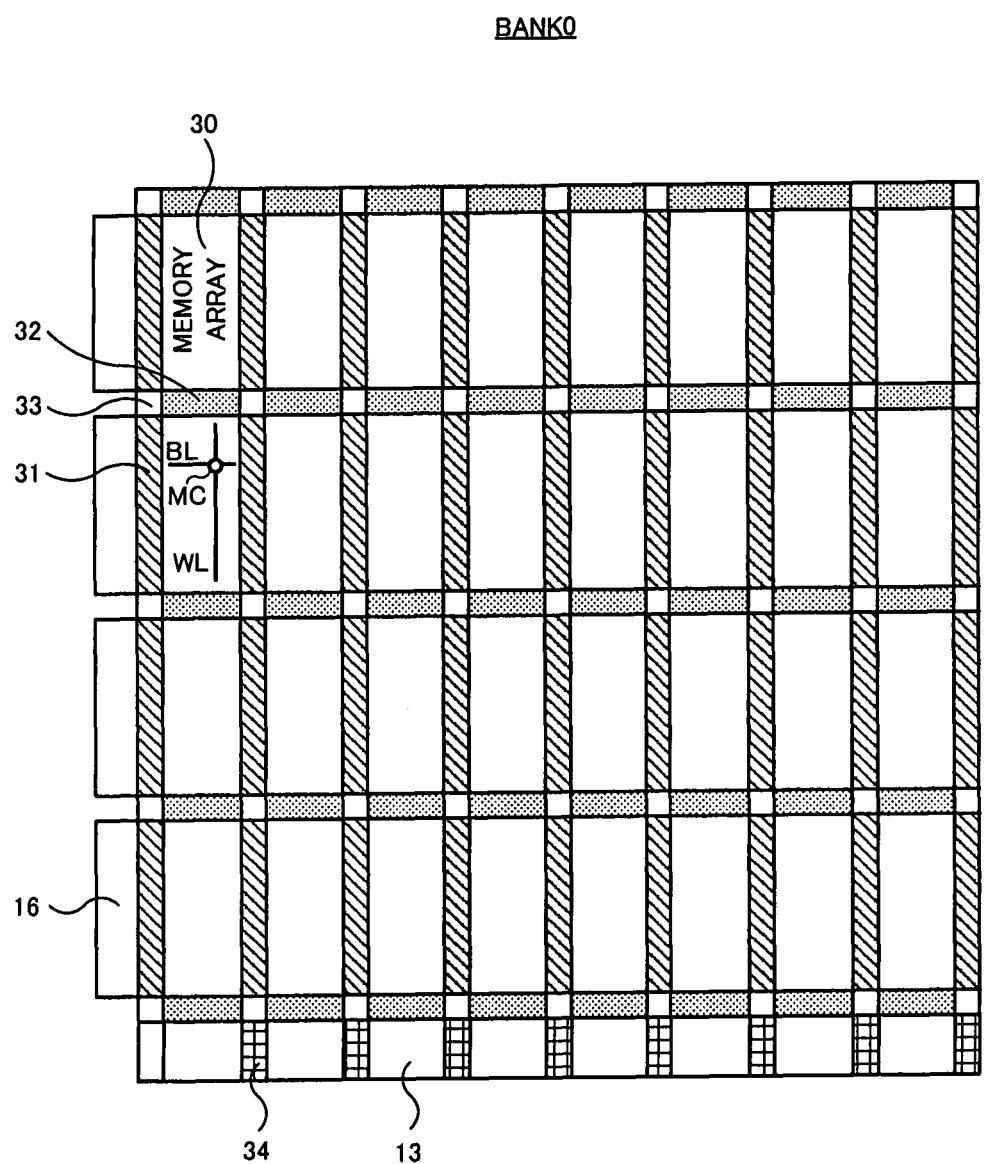
FIG. 2 is a block diagram showing a configuration example of a bank in a memory array region of the first embodiment.

FIG. 2 is a block diagram showing a configuration example of a bank (BANK0) in the memory array region 10 of FIG. 1. As shown in FIG. 2, a plurality of memory arrays 30 are arranged in a matrix form in the bank. Sense amplifier rows 31 each including a plurality of sense amplifiers are arranged on both sides in the bit line extending direction of each memory array 30, and sub-word driver rows 32 each including a plurality of sub-word drivers are arranged on both sides in the word line extending direction of each memory array 30. Further, crosspoint sections 33 are arranged in regions where a sequence of the sub-word driver rows 32 and a sequence of the sense amplifier rows 31 intersect each other. In addition, specific configurations of each sense amplifier row 31, each sub-word driver row 32 and each crosspoint section 33 will be described later. Furthermore, a plurality of Y decoders 16 are arranged at one ends of memory arrays 30 aligned in the bit line extending direction (eight memory arrays 30 in the example of FIG. 2), and a plurality of X decoders 13 are arranged at one ends of memory arrays 30 aligned in the word line extending direction (four memory arrays 30 in the example of FIG. 2). In addition, array controllers 34 controlling operations of the memory arrays 30 are arranged in regions adjacent to the respective X decoders 13

Figure 3:
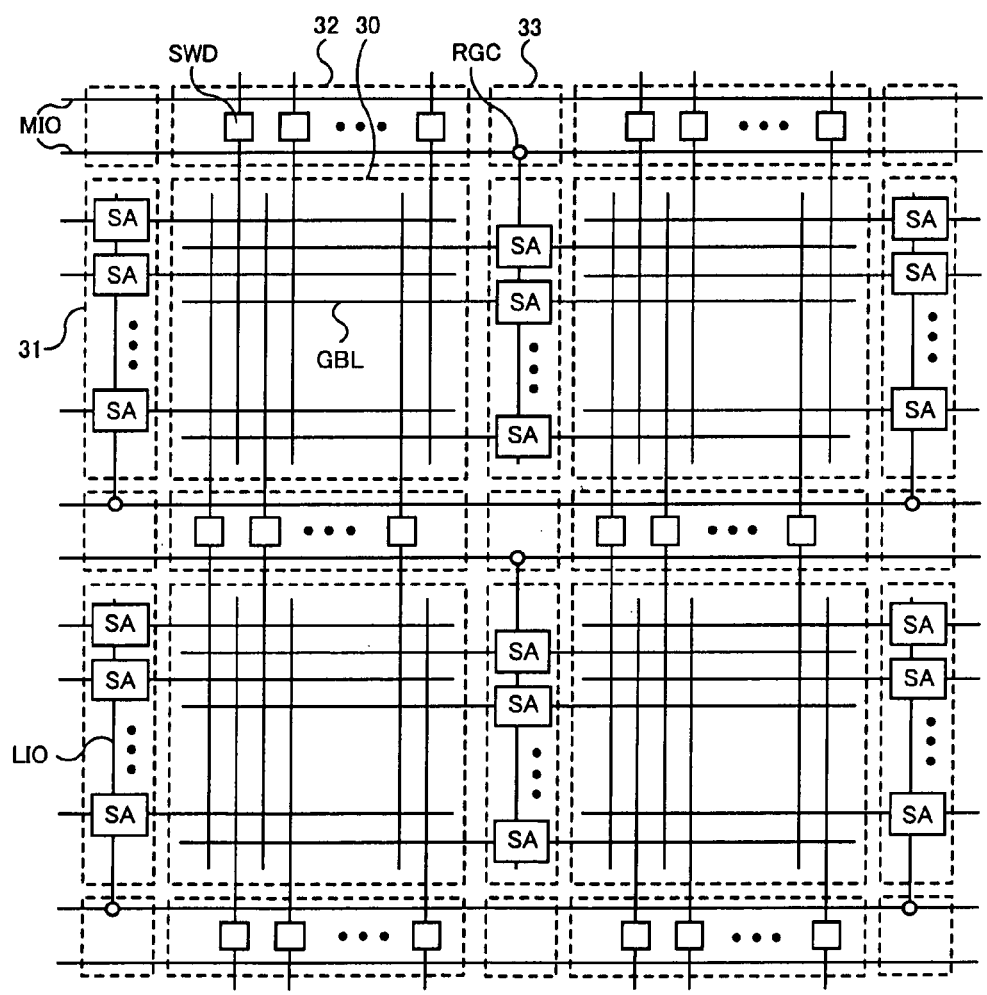
FIG. 3 is a block diagram showing a partial configuration of FIG. 2.

FIG. 3 is a block diagram showing a partial configuration of FIG. 2. As shown in FIG. 3, a plurality of sense amplifiers SA are aligned in each sense amplifier row 31. Since the bit line structure of the first embodiment is hierarchized, a plurality of global bit lines GBL of an upper hierarchy are arranged in each memory array 30 of FIG. 3. The plurality of global bit lines GBL are alternately connected to sense amplifiers SA in one of two sense amplifier rows 31 sandwiching the memory cell array 30 including the global bit lines GBL and sense amplifiers SA in the other of the two sense amplifier rows 31. In the example of FIG. 3, open bit line structure is assumed to be employed, in which each sense amplifier SA in the sense amplifier row 31 is connected to two global bit lines GBL extending into two memory arrays 30 on both sides. Further, a plurality of sub-word drivers SWD are aligned in each sub-word driver row 32. A plurality of word lines WL in each memory array 30 are alternately connected to sub-word drivers SWD in one of two sub-word driver rows 32 sandwiching the memory cell array 30 including the word lines WL and sub-word drivers SWD in the other of the two sub-word driver rows 32. Furthermore, a local input/output line LIO extending in each sense amplifier row 31 and the main input/output line MIO extending in one of adjacent crosspoint sections 33 are connected to each other via a later-described gate circuit RGC in each crosspoint section 33.

Figure 4:
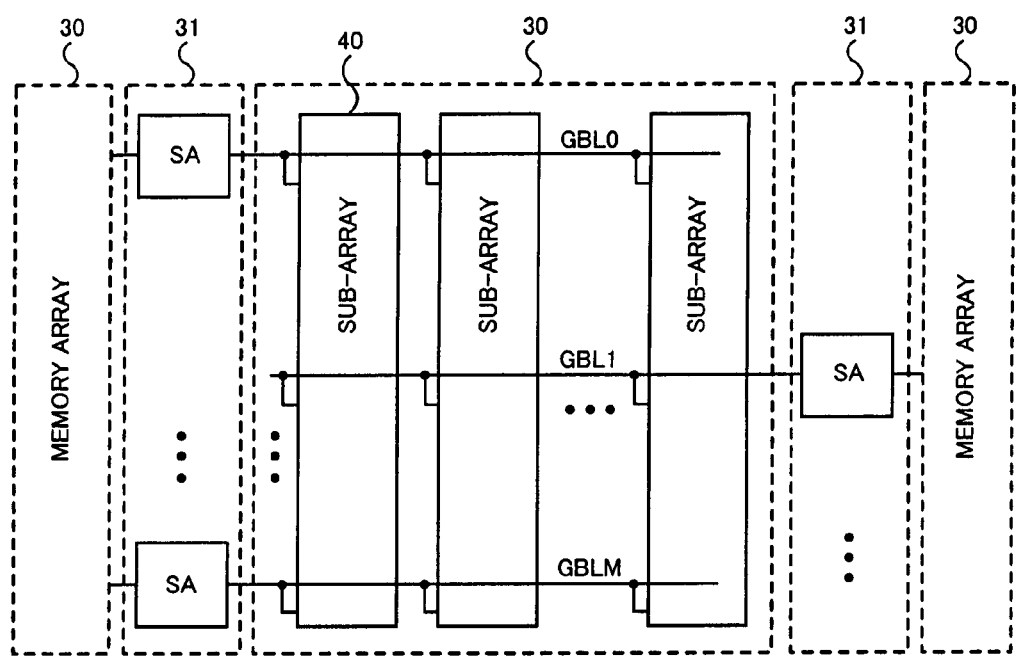
FIG. 4 is a diagram showing a hierarchical structure of a memory array of the first embodiment.
Figure 9:
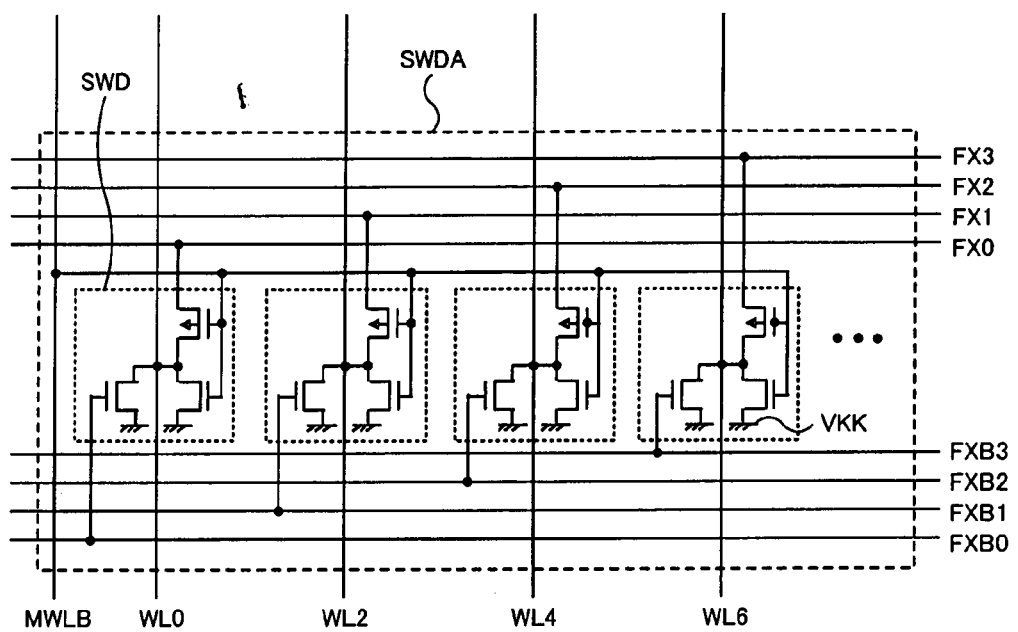
FIG. 9 is a diagram showing a circuit configuration example of a sub-word driver row of the first embodiment.

FIG. 4 shows a hierarchical structure of the memory array 30 of FIG. 3. As shown in FIG. 9, the memory array 30 is divided into a plurality of sub-arrays 40 aligned in the bit line extending direction. The open bit line structure is assumed to be applied to a hierarchical bit line structure, as described above. In the example of FIG. 4, M+1 global bit lines GBLi (i=0 to M) are alternately connected to sense amplifiers SA in sense amplifier rows 31 on both sides and are connected to the plurality of sub-arrays 40.

Figure 5:
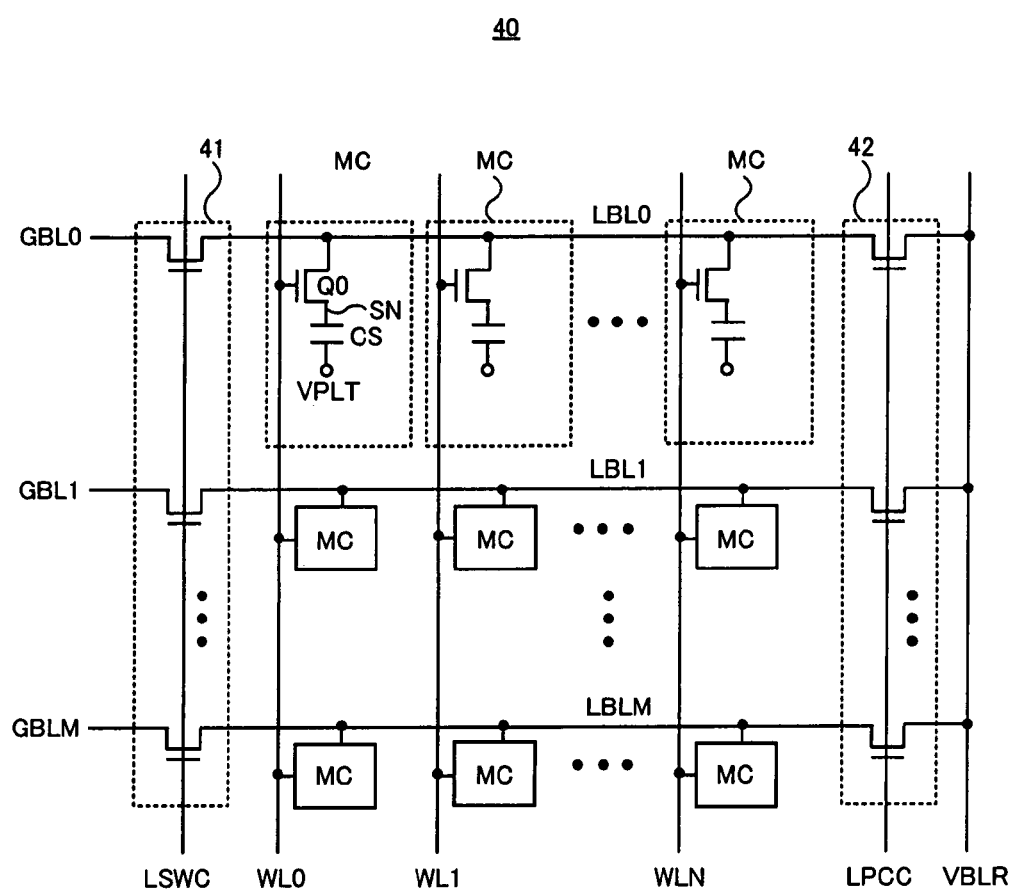
FIG. 5 is a diagram showing a circuit configuration example of a sub-array of the first embodiment.

FIG. 5 shows a circuit configuration example of the sub-array 40 of FIG. 4. M+1 local bit lines LBLi (i=0 to M) of a lower hierarchy corresponding to the M+1 global bit lines GBLi (i=0 to M) are arranged in the sub-array 90 shown in FIG. 5. N+1 memory cells MC formed at intersections of N+1 word lines WLj (j=0 to N) and local bit lines LBL0 to LBLM are connected to the local bit lines LBL0 to LBLM respectively. Each memory cell MC is composed of a select transistor Q0 switched by each of word lines WL0 to WLN and a capacitor CS storing data as charge at a data storage node SN, and a plate voltage VPLT is supplied to the capacitor CS.

A switch circuit 41 includes M+1 NMOS transistors disposed between the global bit lines GBL0 to GBLM and the local bit lines LBL0 to LBLM, and a control signal LSWC is applied to respective gates of the NMOS transistors. A precharge circuit 42 includes M+1 NMOS transistors disposed between the local bit lines LBL0 to LBLM and a line of a precharge voltage VBLR, and a control signal LPCC is applied to respective gates of the NMOS transistors.

Figure 6:
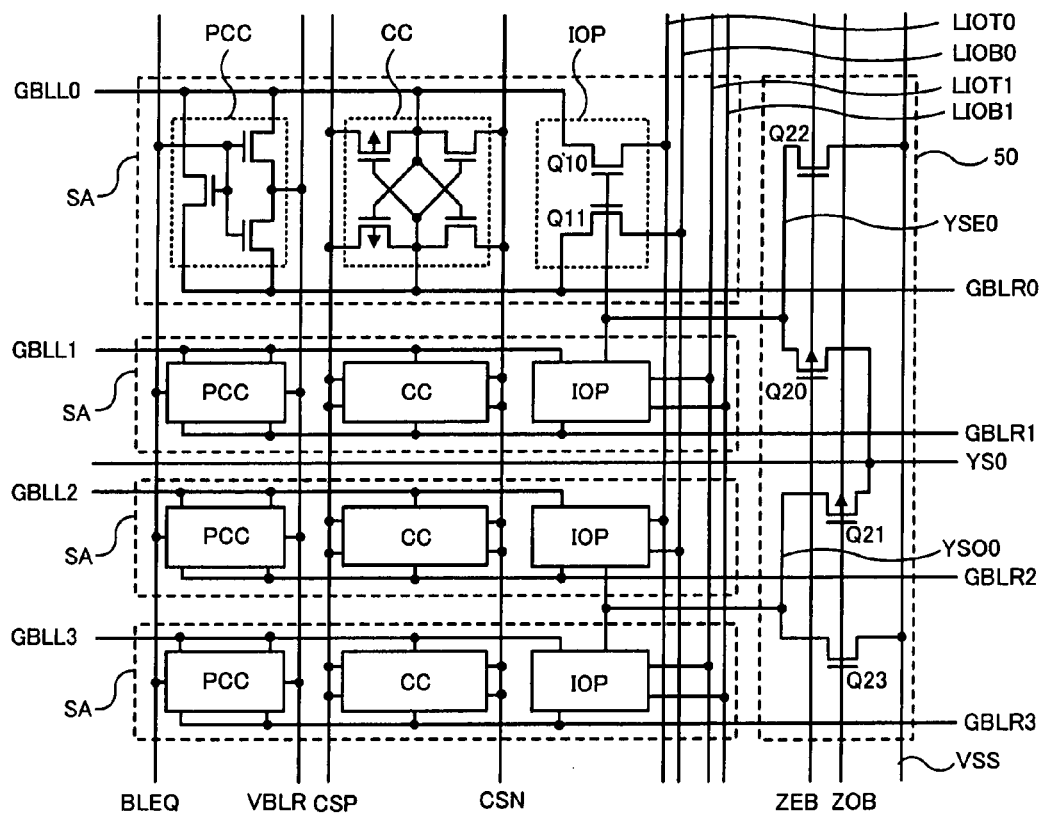
FIG. 6 is a diagram showing a circuit configuration example of a sense amplifier row of the first embodiment.
Figure 6A:
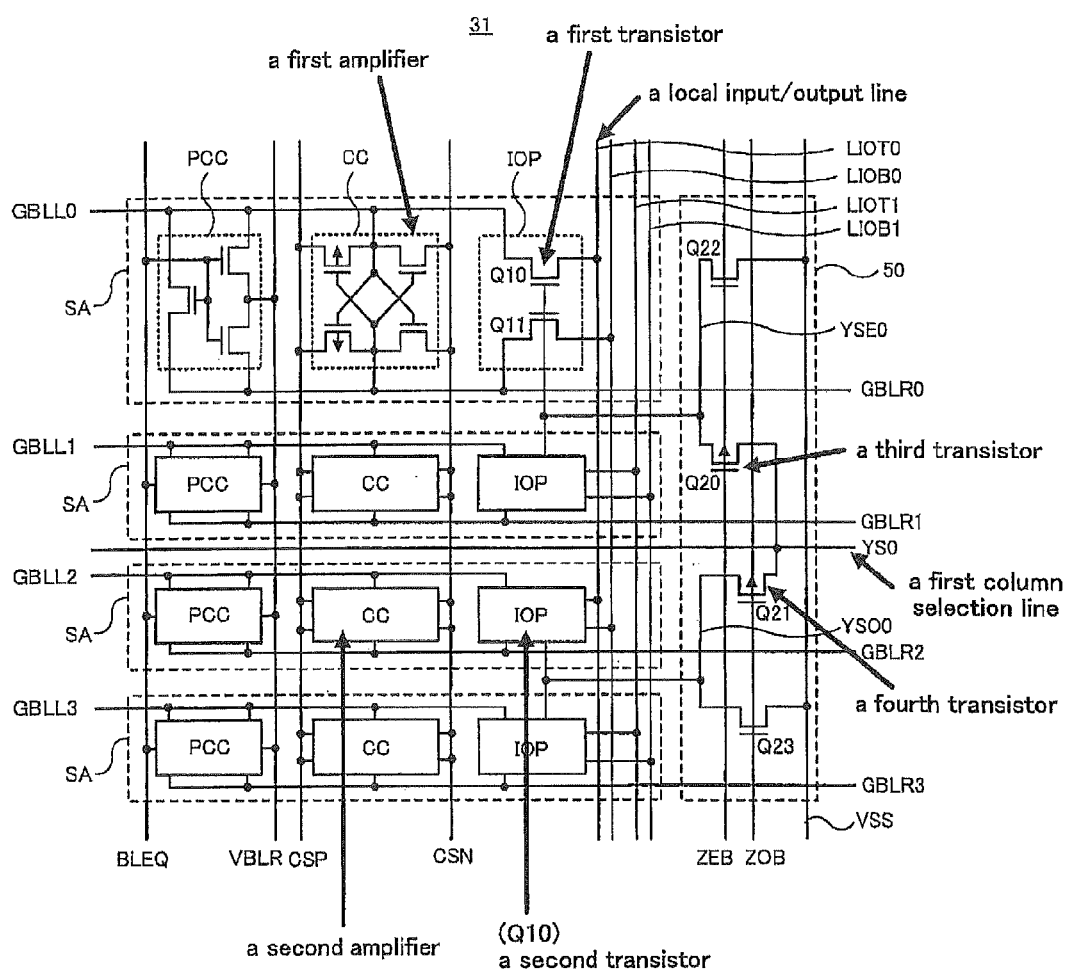

FIG. 6 shows a circuit configuration example of the sense amplifier row 31 of FIG. 4. FIG. 6 corresponds to a range where four pairs of the global bit lines GBLLi (1=0 to 3) and GBLRi (i=0 to 3) and two pairs of (four) local input/output lines LIO (LIOT0, LIOB0, LIOT1 and LIOB1) are arranged. The global bit line GBLLi on the left side and the global bit line GBLRi on the right side form a complementary pair. Four sense amplifiers SA and a sub-column select circuit 50 are arranged corresponding to four global bit lines GBLL0 to GBLL3 (the bit lines of the invention). Each sense amplifier SA includes a precharge circuit PCC, a cross couple circuit CC (the amplifier of the invention) and an input/output port IOP (the local column switch of the invention).

The precharge circuit PCC is composed of a pair of NMOS transistors precharging one global bit line GBLLi and the other global bit line GBLRi to the precharge voltage VBLR, and an NMOS transistor equalizing a pair of global bit lines GBLLi and GBLRi, respectively, in response to a bit line equalizing signal BLEQ.

The cross couple circuit CC functions as a latch circuit in which an inverter circuit receiving a signal of one global bit line GBLLi and an inverter circuit receiving a signal of the other global bit line GBLRi are cross-coupled to each other at their inputs and outputs. A pair of common source lines CSN and CSP is supplied to the MOS transistors of the cross couple circuit CC. The cross couple circuit CC binarizes a voltage difference between the global bit lines GBLLi and GBLRi and latches it.

The input/output port IOP is composed of an NMOS transistor Q10 connected between the global bit line GBLLi and the local input/output line LIOT0 (LIOT1) and an NMOS transistor Q11 connected between the global bit line GBLRi and the local input/output line LIOB0 (LIOB1). Gates of the NMOS transistors Q10 and Q11 are connected to a sub-column select line YSE0 (YSO0), and the pair of global bit lines GBL is controlled to be connected to a pair of local input/output lines LIO (LIOT0, LIOB0, LIOT1 and LIOB1), as described later. In addition, a pair of local input/output lines LIOT0 and LIOB0 is connected to the input/output port IOP corresponding to even-numbered global bit lines GBLL0 and GBLL2, and a pair of local input/output lines LIOT1 and LIOB1 is connected to the input/output port IOP corresponding to odd-numbered global bit lines GBLL1 and GBLL3.

The sub-column select circuit 50 shown in FIG. 6 includes PMOS transistors Q20 and Q21 (the global column switch of the invention) and NMOS transistors Q22 and Q23. One column select line YS0, two sub-column select lines YSE0 and YSO0, two sense amplifier select lines ZEB and ZOB (lines of the first and second select signals of the invention) and the ground potential VSS are respectively connected to the sub-column select circuit 50. One source/drain electrode of each of the PMOS transistors Q20 and Q21 is connected to the column select line YS0, and one source/drain electrode of each of the NMOS transistors Q22 and Q23 is connected to the ground potential VSS. The other source/drain electrode of each of the PMOS transistor Q20 and NMOS transistor Q22 is connected to the sub-column select line YSE0, and each gate thereof is connected to the sense amplifier select line ZEB. Further, the other source/drain electrode of each of the PMOS transistor Q21 and NMOS transistor Q23 is connected to the sub-column select line YSO0, and each gate thereof is connected to the sense amplifier select line ZOB. The sub-column select circuit 50 having such a configuration is repeatedly arranged in the word line, extending direction for each four global bit lines GBL.

Figure 7:
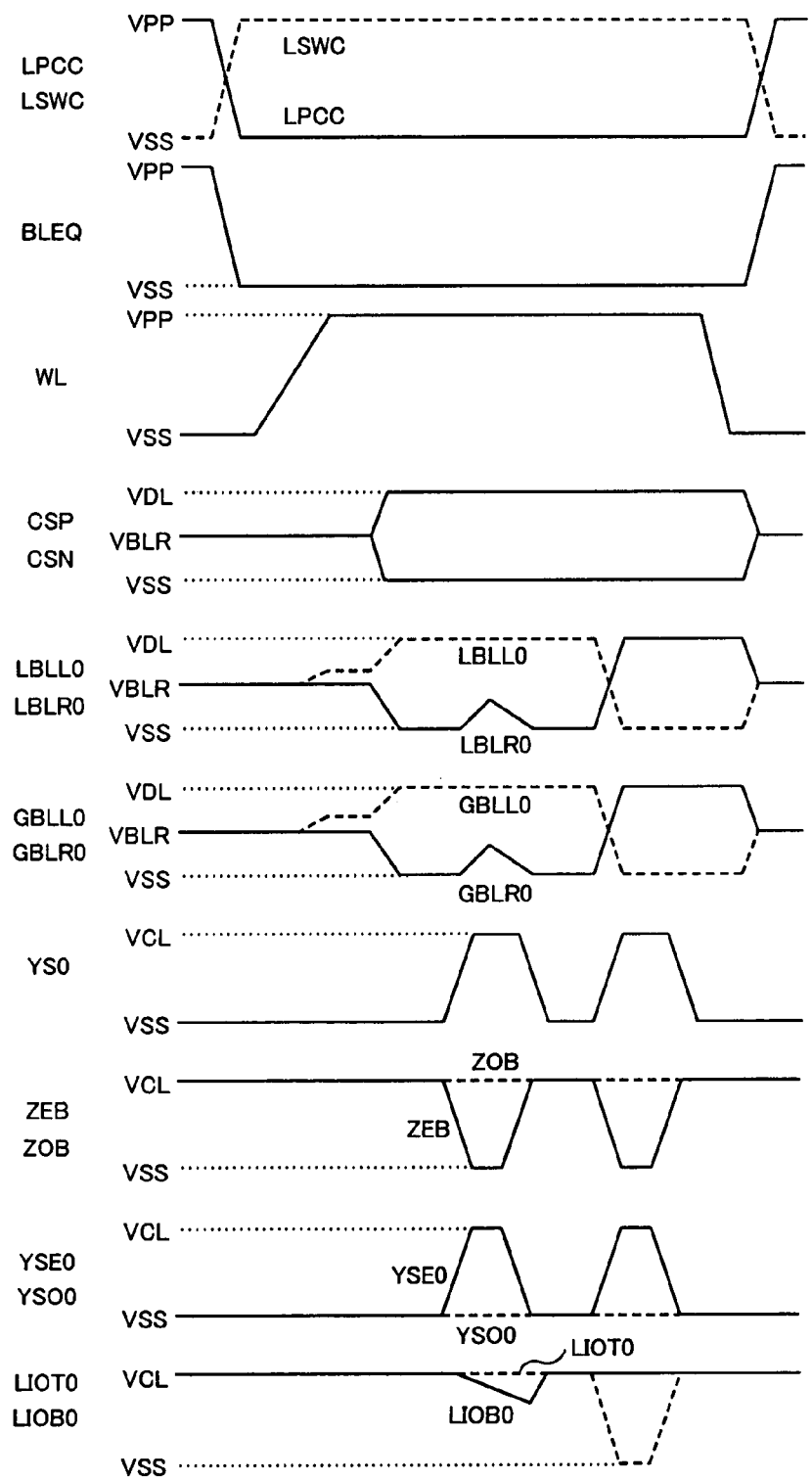
FIG. 7 is a diagram showing operation waveforms at various parts in the sense amplifier row of FIG. 6.

The operation of the sense amplifier row 31 of FIG. 6 will be described with reference to FIG. 7, including selection control by the sub-column select circuit 50. FIG. 7 shows operation waveforms at various parts in FIG. 6. Here, the low level of all the operation waveforms of FIG. 7 is the ground potential VSS, and however high levels thereof are different from one another, as described below. That is, the high level of the control signals LPCC and LSWC, the bit line equalizing signal BLEQ and the word line WL is controlled to be the boost voltage VPP. The high level of the common source line CSN is controlled to be the precharge voltage VBLR. The high level of the common source line CSP, the local bit lines LBLL0 and LBLR0, and the global bit lines GBLL0 and GBLR0 is controlled to be the supply voltage VDL. The high level of the column select line YS0, the sense amplifier select lines ZEB and ZOB, and the sub-column select lines YSE0 and YSO0 is controlled to be the supply voltage VCL.

In an early time of FIG. 7, the local bit lines LBLL0 and LBLR0 and the global bit lines GBLL0 and GBLR0 are all in a state of being precharged to the precharge voltage VBLR, and the precharged state is cancelled when the bit line equalizing signal BLEQ is changed to "low". Then, when the word line WL is driven to "high", the local bit line LBLL0 and the global bit line GBLL0 rise to a predetermined potential corresponding to stored data ("high" data) in the memory cell MC. Thereafter, the sense amplifier SA is activated by the common source lines CSN and CSP, and the local bit line LBLL0 and the global bit line GBLL0 become "high".

Meanwhile, in the sub-column select circuit 50, the column select line YS0 is "low" and the sense amplifier select lines ZEB and ZOB are "high", respectively, in the early time. Therefore, the sub-column select lines YSE0 and YSO0 are maintained at "low" through the NMOS transistors Q22 and Q23 of FIG. 6. At a predetermined timing after the local bit line LBLL0 and the global bit line GBLL0 rise to "high", the column select line YS0 is changed to "high" and one sense amplifier select line ZEB is changed to "low". Thereby, the PMOS transistor Q20 turns on, and the sub-column select line YSE0 and the column select line YS0 are connected to each other so that the sub-column select line YSE0 changes to "high". Therefore, the NMOS transistors Q10 and Q11 of the input/output port IOP turn on, and data of the sense amplifier SA is outputted to the local input/output lines LIOT0 and LIOB0. At this point, although both the global bit line GBLL0 and the input/output line LIOT0 remain "high", a slight potential change appears in each of the global bit line GBLR0 and the input/output line LIOB0, which reflects the respective voltage difference. After a predetermined time of period elapses, the sense amplifier select line ZEB is returned to "high", and the column select line YS0 becomes "low".

Thereafter, the sense amplifier select line ZEB is changed to "low" again, the column select line YS0 is changed to "high", and one input/output line LIOT0 changes to "low". At this point, potentials of the pair of global bit lines GBLL0 and GBLR0 are inverted, and similarly potentials of the pair of local bit lines LBLL0 and LBLR0 are inverted. Thereby, "low" data is written into the memory cell MC connected to the local bit line LBLL0. After a predetermined time of period elapses, the sense amplifier select line ZEB is returned to "high", and the column select line YS0 becomes "low". Thereafter, the word line WL is returned to "low", and other operation waveforms are returned to initial states.

Figure 8:
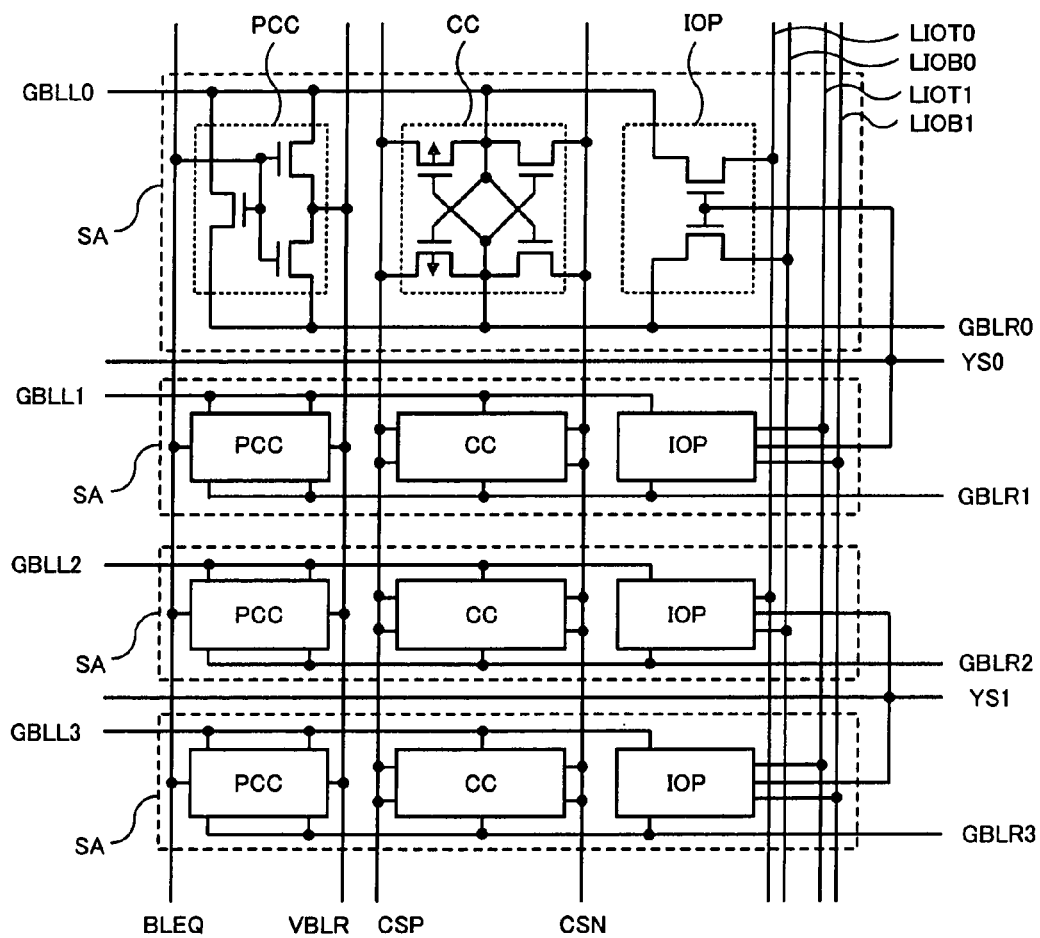
FIG. 8 is a diagram showing a circuit configuration of a conventional general sense amplifier row.

In the first embodiment, a structural feature of the sub-column select circuit 50 is that the number of the column select line YS0 arranged corresponding to the number of the global bit lines GBLLi can be reduced to half. Here, a circuit configuration of a conventional general sense amplifier row 31a is shown in FIG. 8 in order to compare with the configuration of FIG. 6. In FIG. 8, configurations of the precharge circuit PCC, the cross couple circuit CC and the input/output port IOP that are included in each sense amplifier SA are the same as those of FIG. 6. Further, although four global bit lines GBLLi and two pairs of local input/output lines LIO (LIOT0, LIOB0, LIOT1 and LIOB1) are arranged in the same manner as in FIG. 6, a difference exists in that two column select lines YS0 and YS1 are arranged in FIG. 8. That is, one column select line YS0 is connected to each input/output port IOP of two sense amplifiers SA on the upper side, while the other column select line YS1 is connected to each input/output port IOP of two sense amplifiers SA on the lower side.

In FIG. 8, two column select line YS (YS0 and YS1) are arranged for each four sense amplifiers SA, and in contrast, only one column select line YS (YS0) is arranged for each four sense amplifiers SA in FIG. 6 of the first embodiment. This indicates that the number of column select lines YS arranged in the sense amplifier row 31 of FIG. 6 is half that of FIG. 8. Particularly, when the number of sense amplifiers SA increases with an increase in the number of the global bit lines GBLLi, there arises a problem of an increase in area due to a large number of the column select lines YS in the configuration of FIG. 8, and thus a higher effect of employing the configuration of FIG. 6 can be obtained. In addition, since the sub-column select lines YSE0 and YSO0, the sense amplifier select lines ZEB and ZOB, and transistors in the sub-column select circuit 50 do not extend over the sense amplifier row 31, influence of the increase in area is small. By employing the configuration of the first embodiment, a required area for arranging the column select lines YS can be reduced. Therefore an area for power supply lines can be obtained, and a configuration advantageous for suppressing power supply noise can be achieved, which will be described in detail later.

In the first embodiment, a case of arranging two pairs of the local input/output lines LIO has been described. However, in a more general case where N (N is an even number) pairs of local input/output lines LIO are arranged, the sub-column select circuit 50 of FIG. 6 may be repeatedly arranged and one column select lines YS may be arranged for each 2N sense amplifiers SA.

Next, FIG. 9 shows a circuit configuration example of the sub-word driver row 32 of FIG. 3. In FIG. 9, each of sub-word drivers SWD included in the sub-word driver row 32 is composed of one PMOS transistor and two NMOS transistors. In the sub-word driver row 32, four sub-word select lines FX0 to FX3 and four sub-word select lines FXB0 to FXB3 having reverse polarities are respectively arranged for selecting the sub-word drivers SWD. Then, when the main word line MWLB is activated, each sub-word driver SWD is selected in accordance with a combination of the sub-word select lines FX0 to FX3 (FXB0 to FXB3) so as to drive one word line WL among alternately arranged word lines WLi (i=0, 2, 4 and 6).

Figure 10:
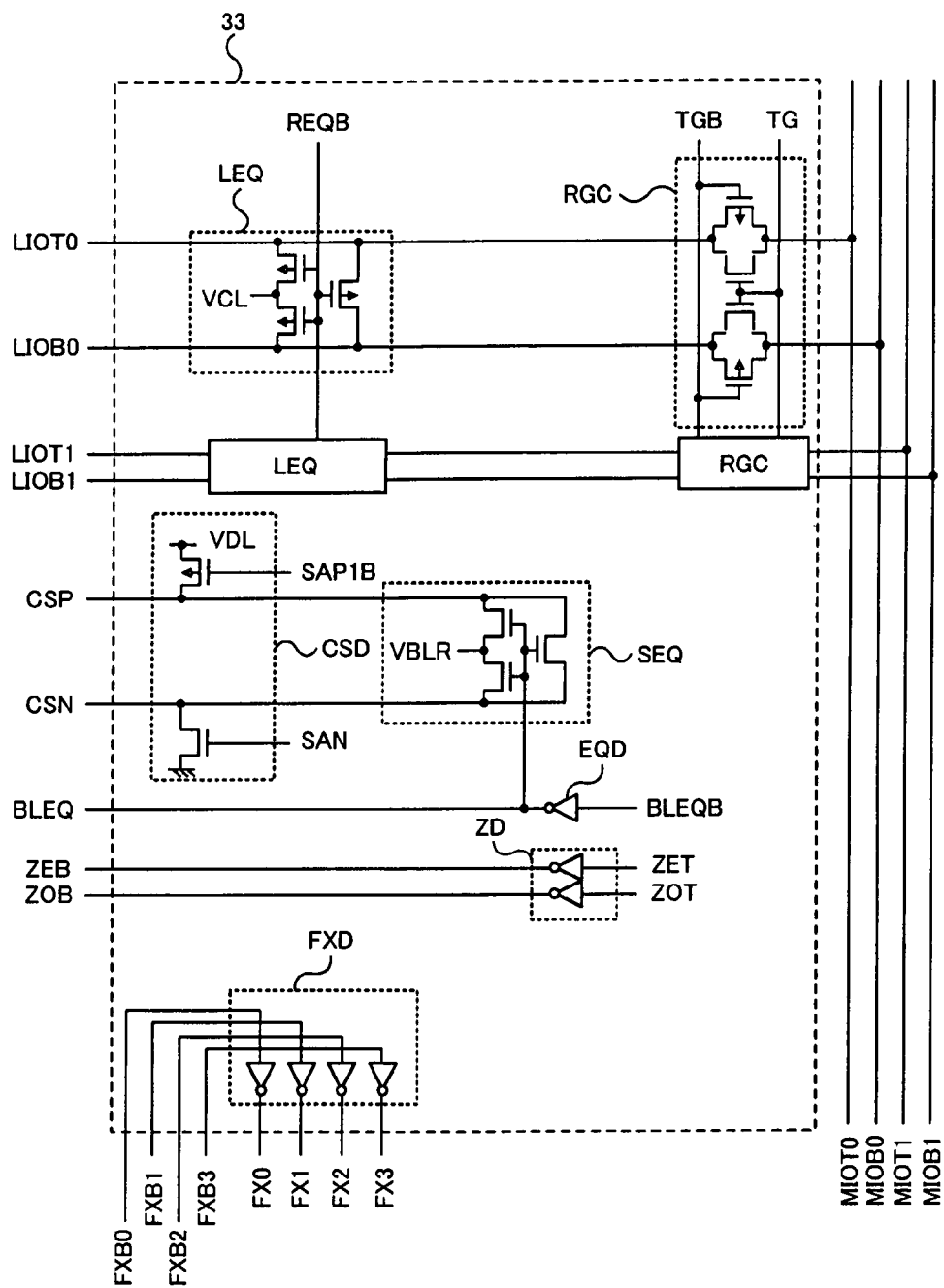
FIG. 10 is a diagram showing a circuit configuration example of a crosspoint section of the first embodiment.

FIG. 10 shows a circuit configuration example of the crosspoint section 33 of FIG. 3. In the crosspoint section 33 shown in FIG. 10, local input/output lines LIOT (LIOT0, LIOT1) and LIOB (LIOB0, LIOB1) for data transfer, the common source lines CSP and CSN connected to the sense amplifiers SA, a line of the bit line equalizing signal BLEQ connected to the bit lines BL, the sense amplifier select lines ZEB and ZOB, and the above sub-word select lines FX0 to FX3 (FXB0 to FXB3) are respectively wired for external connection, and circuits corresponding to these lines are provided.

A precharge circuit LEQ and a gate circuit RGC are provided for the pair of local input/output lines LIOT and LIOB. The precharge circuit LEQ is composed of a pair of PMOS transistors for precharging the local input/output lines LIOT and LIOB to the supply voltage VCL and a PMOS transistor for equalizing the local input/output lines LIOT and LIOB, respectively, in response to a control signal REQB. The gate circuit RGC is composed of a first transfer gate for controlling a connection state between the local input/output line LIOT and the main input/output line MIOT and a second transfer gate for controlling a connection state between the local input/output line LIOB and the main input/output line MIOB, respectively, in response to a control signal TG and a control signal TGB having a reverse polarity.

A driver circuit CSD and an equalizing circuit SEQ are provided for the pair of common source lines CSP and CSN. The driver circuit CSD is composed of a PMOS transistor supplying the supply voltage VDL to the common source line CSP in response to a control signal SAP1B, and an NMOS transistor supplying the ground potential to the common source line CSN in response to a control signal SAN. In addition, one common source line CSP is connected to sources of respective PMOS transistors in the sense amplifier SA, and the other common source line CSN is connected to sources of respective NMOS transistors in the sense amplifier SA. The equalizing circuit SEQ is composed of three NMOS transistors for precharging and equalizing the pair of common source lines CSP and CSN to the precharge voltage VBLR in response to the bit line equalizing signal BLEQ. Further, the driver circuit EQD is composed of an inverter that inverts the bit line equalizing signal BLEQB so as to output the bit line equalizing signal BLEQ.

A Z driver ZD is provided for the pair of sense amplifier select lines ZEB and ZOB. The Z driver ZD is composed of an inverter that inverts a control line ZET so as to output it to the sense amplifier select line ZEB, and an inverter that inverts a control signal ZOT so as to output it to the sense amplifier select line ZOB. Further, a FX driver FXD is provided corresponding to the four sub-word select lines FX0 to FX3. The FX driver FXD is composed of four inverters that invert the four sub-word select lines FXB0 to FXB3 respectively so as to output the four sub-word select lines FX0 to FX3.

As described in the embodiment, when the invention is applied to the semiconductor device in which both the bit line structure and the sense amplifier structure are hierarchized, since the bit lines and amplifiers are high-densely arranged, a larger effect can be obtained by reducing the number of column select lines.

[Second Embodiment]

Figure 11:
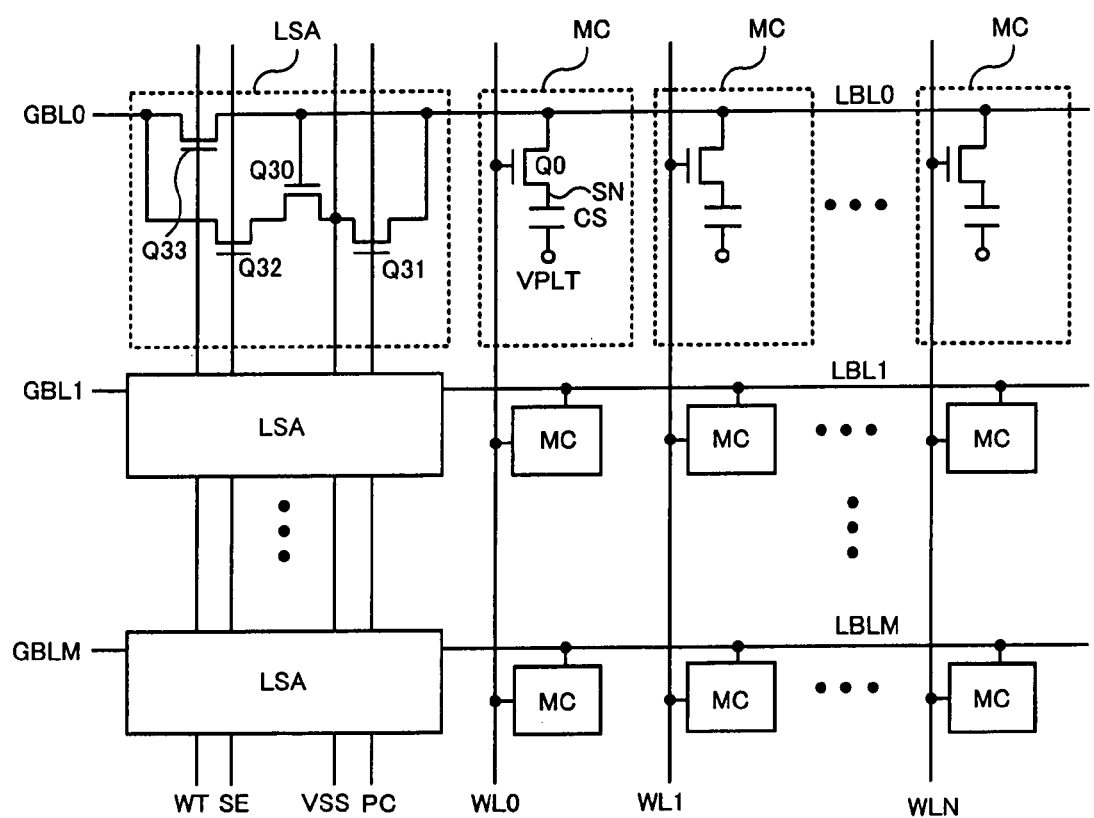
FIG. 11 is a diagram showing a circuit configuration example of a sub-array of a second embodiment.

In the second embodiment, the invention is applied to the DRAM in which both the bit line structure and the sense amplifier structure are hierarchized (hierarchical bit line array). In the second embodiment, configurations and operations of FIGS. 1 to 4, 9 and 10 are common to those of the first embodiment, and thus descriptions different from the first embodiment will be mainly made below. FIG. 11 shows a circuit configuration example of the sub-array 40 (FIG. 4) in the memory array 30 of the second embodiment. The sub-array 40 shown in FIG. 11 includes M+1 local sense amplifiers LSA connected between M+1 global bit lines GBLi (i=0 to M) and M+1 local bit lines LBLi (i=0 to M). Each local bit line LBL is connected to the memory cells MC at respective intersections with N+1 word lines WLj (j=0 to N). In addition, each memory cell MC has the same structure as that in FIG. 5 of the first embodiment.

Each local sense amplifier LSA is a single-ended sense amplifier composed of four NMOS transistors Q30, Q31, Q32 and Q33. The NMOS transistor Q30 has a gate connected to the local bit line LBL, and senses and amplifies a signal voltage transmitted from a selected memory cell MC to the local bit line LBL. The NMOS transistor Q31 precharges the local bit line LBL to the ground potential VSS in response to a precharge signal PC applied to its gate. The NMOS transistor Q32 controls a connection between the global bit line GBL and the NMOS transistor Q30 in response to a control signal SE applied to its gate. The NMOS transistor Q33 controls a connection between the local bit line LBL and the global bit line GBL in response to a control signal WT applied to its gate. As shown in FIG. 11, since both the bit line structure and the sense amplifier structure are hierarchized, the number of memory cells of the local bit line LBL can be reduced so as to reduce the capacitance of each local bit line LBL. Therefore, even if the capacitance of the capacitor CS is small, the level of the signal outputted to the global bit line GBL can be sufficiently large.

Figure 12:
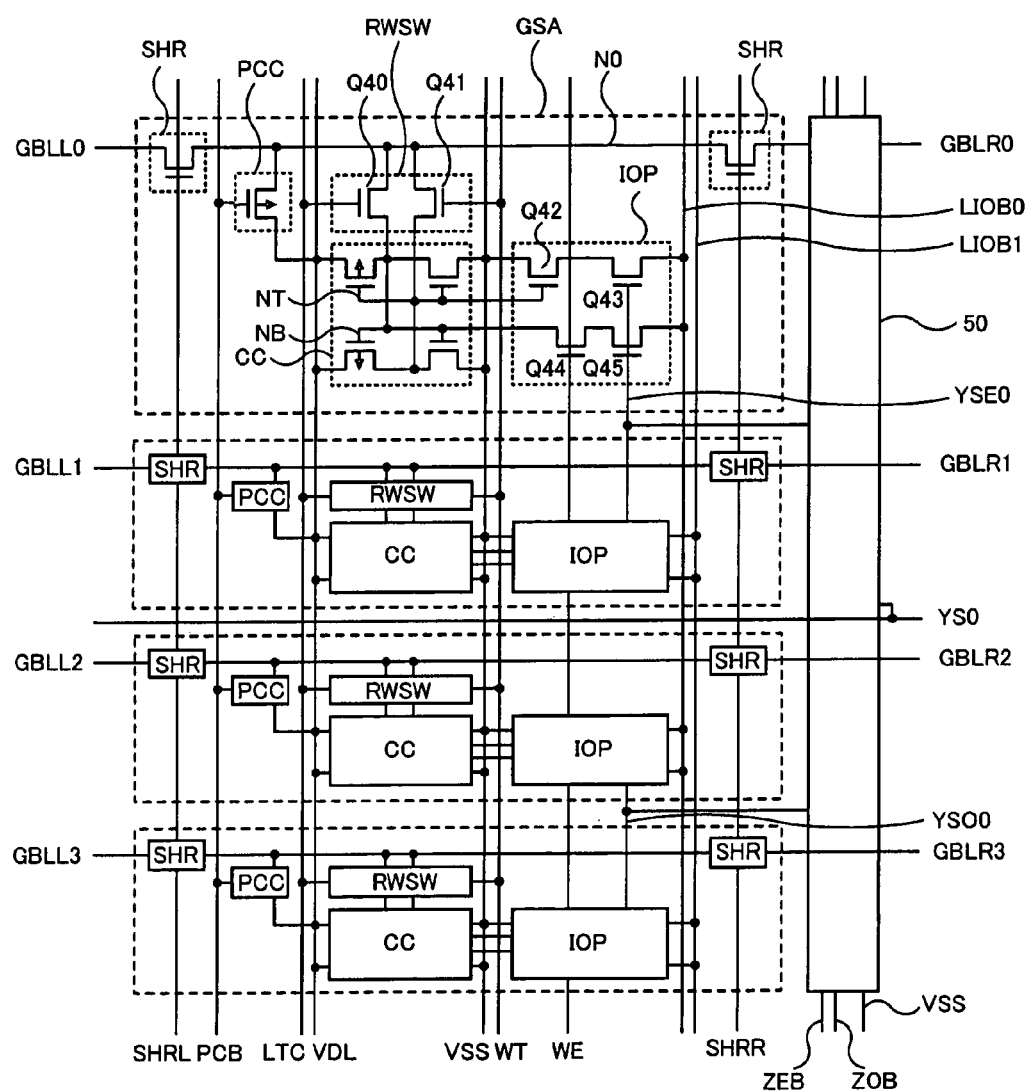
FIG. 12 is a diagram showing a circuit configuration example of a sense amplifier row of the second embodiment.

FIG. 12 shows a circuit configuration example of the sense amplifier row 31 (FIG. 4) of the second embodiment. The sense amplifier row 31 shown in FIG. 12 includes four global sense amplifiers GSA connected to the four global bit lines GBLLi (i=0 to 3). Each global sense amplifier GSA is connected to two local input/output lines LIOB0 and LIOB1. Here, each global sense amplifier GSA corresponds to the sense amplifier SA of FIG. 3. Further, the sub-column select circuit 50 is disposed on the right side of the sense amplifier row 31 of FIG. 12. The configuration of the sub-column select circuit 50 is the same as that in FIG. 6. Each global sense amplifier GSA is composed of two shared switches SHR on both sides, a precharge circuit PCC, a read/write switch RWSW, a cross couple circuit CC and an input/output port IOP.

Each of the shared switches SHR is an NMOS transistor that controls a connection between the global bit line GBL and a node N0 in the global sense amplifier GSA in response to a control signal SHRL (SHRR). In FIG. 12, the control signal SHRL is applied to the shared switch SHR on the left side, and the control signal SHRR is applied to the shared switch SHR on the right side. The precharge circuit PCC is a PMOS transistor that precharges the node N0 to the supply voltage VDL in response to a precharge signal PCB. The read/write switch RWSW is composed of two NMOS transistors Q40 and Q41 disposed between the node N0 and the cross couple circuit CC. One NMOS transistor Q40 controls a connection between the node N0 and a node NB in the cross couple circuit CC in response to a control signal LTC, and the other NMOS transistor Q41 controls a connection between the node N0 and a node NT in the cross couple circuit CC in response to a control signal WT.

The cross couple circuit CC functions as a latch circuit in which an inverter circuit receiving a signal of the node NB and an inverter circuit receiving a signal of the node NT are cross-coupled to each other at their inputs and outputs. The supply voltage VDL and the ground potential VSS are supplied to the cross couple circuit CC. The cross couple circuit CC binarizes and latches the potential at the node N0 that is transmitted via the read/write switch RWSW. The input/output port IOP is composed of NMOS transistors Q42 and Q43 connected in series between the ground potential VSS and the local input/output line LIOB0 (LIOB1) and NMOS transistors Q44 and Q45 connected in series between the node NB and the local input/output line LIOB0 (LIOB1). The gate of the NMOS transistor Q42 is connected to the node NT, the gate of the MMOS transistor Q44 receives a control signal WE, and gates of the NMOS transistors Q43 and Q45 are connected to the sub-column select line YSE0 (YSO0). In FIG. 12, it is a feature that the local input/output line LIOB0 (LIOB1) has a single-ended configuration corresponding to the hierarchical sense amplifiers, as different from FIG. 6.

Figure 13:
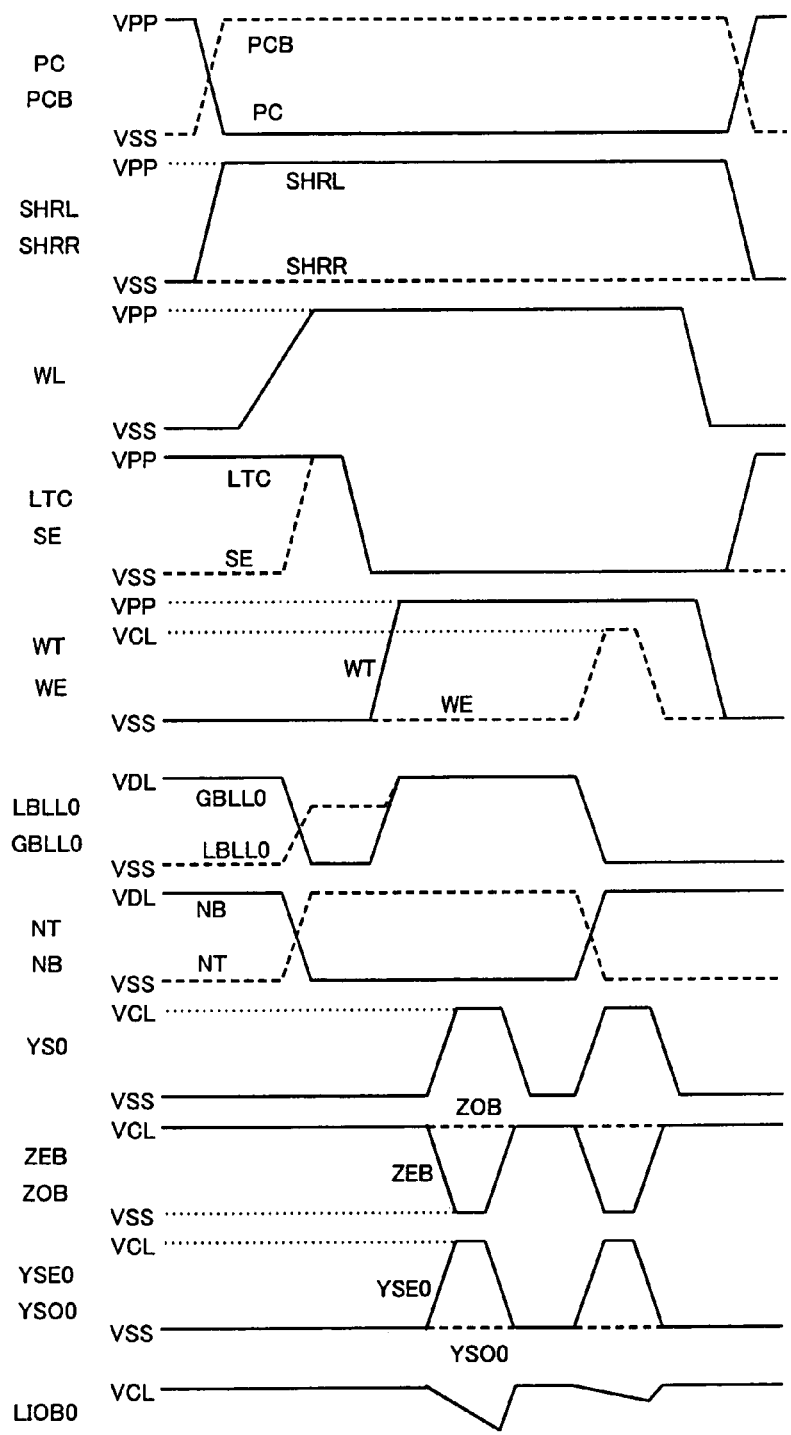
FIG. 13 is a diagram showing operation waveforms at various parts in the sense amplifier row of FIG. 12.

Hereinafter, an operation of the sense amplifier row 31 of FIG. 12 will be described with reference to FIG. 13. FIG. 13 shows operation waveforms at various parts in FIG. 12. In addition, while the low level of all the operation waveforms in FIG. 13 is the ground potential VSS, high levels thereof are different in the following manner. That is, the high level of the precharge signals PC, PCB, the control signals SHRL, SHRR, the word line WL, the control signals MC, SE and WT is controlled to be the boost voltage VPP. The high level of the control signal WE, the column select lines YS0, YSE0, YSO0, the sense amplifier select lines ZEB, ZOB, and the local input/output line LIOB0 is controlled to be the supply voltage VCL. The high level of the local bit line LBLL0, the global bit line GBLL0, and the nodes NT, NB in the global sense amplifier GSA is controlled to be the supply voltage VDL.

In an early time of FIG. 13, both the local bit line LBLL0 and the global bit line GBLL0 are in a precharged state. When a precharge period is finished, the precharge signal PC is changed to "low", the precharge signal PCB is changed to "high", and the control signal SHRL applied to the shared switch SHR of FIG. 12 is changed to "high". Subsequently, when a selected word line WL is driven to "high", the local bit line LBLL0 rises to a predetermined potential corresponding to stored data ("high" data) in the memory cell MC. Then, when the control signal SE is changed to "high" so that the NMOS transistor Q32 (FIG. 11) is turned on, the global bit line GBLL0 becomes "low". At this point, while potentials of the nodes NT and NB are inverted respectively, the local input/output line LIOB0 remains "high".

Thereafter, when the control signal LTC is changed to "low" and subsequently the control signal WT is changed to "high", the global bit line GBLL0 and the local bit line LBLL0 are both changed to "high". At this point, the "high" data is restored to the memory cell MC. Thereafter, the column select line YS0, the sub-column select lines YSE0, YSO0 and the sense amplifier select lines ZEB, ZOB in the sub-column select circuit 50 are controlled in the same manner as in FIG. 7, so description thereof will be omitted. After the data of the sense amplifier SA is outputted to the local input/output line LIOB0 under the control of the sub-column select circuit 50, data of the local input/output line LIOB0 is sent to the sense amplifier SA in a state where the control signal WE is set to "high", so that the nodes NT and NB are inverted, and the global bit line GBLL0 and the local bit line LBLL0 are both changed to "low".

Figure 14:
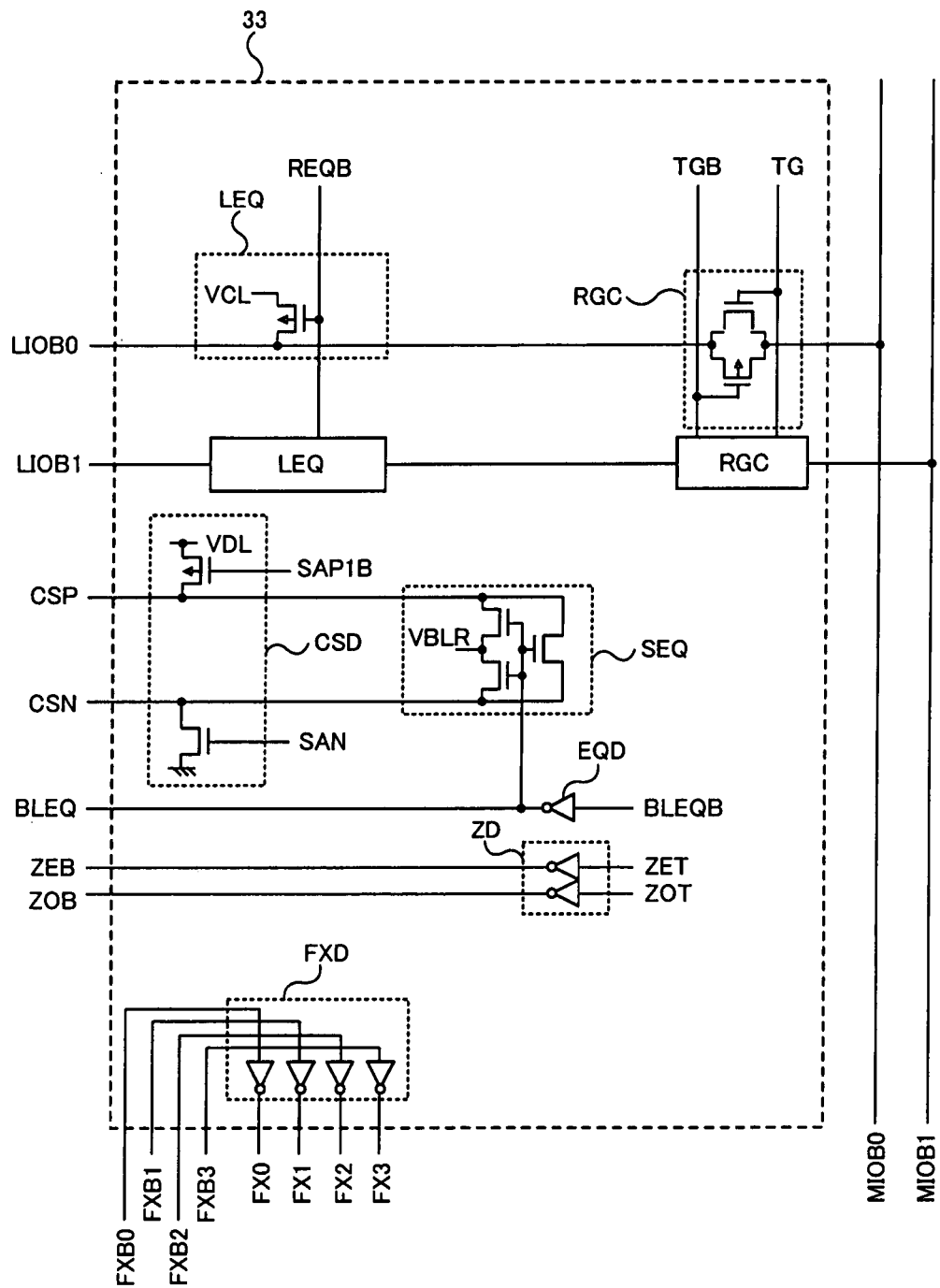
FIG. 14 is a diagram showing a circuit configuration example of a crosspoint section of the second embodiment.

Next, FIG. 14 shows a circuit configuration example of the crosspoint section 33 (FIG. 3) of the second embodiment. Although most of elements of the crosspoint section 33 shown in FIG. 14 are common to those in FIG. 10 of the first embodiment, configurations of the precharge circuit LEQ and the gate circuit RGC provided corresponding to the single-ended local input/output lines LIOB0 and LIOB1 are different. Specifically, the precharge circuit LEQ of FIG. 14 is a PMOS transistor for precharging the local input/output line LIOB0 (LIOB1) to the supply voltage VCL in response to the control signal REQB. Further, the gate circuit RGC is a transfer gate for controlling a connection state between the local input/output line LIOB and the main input/output line MIOB in response to the control signal TG and the control signal TGB having a reverse polarity. Other elements are the same as in FIG. 10, so description thereof will be omitted.

[Third Embodiment]

Figure 15:
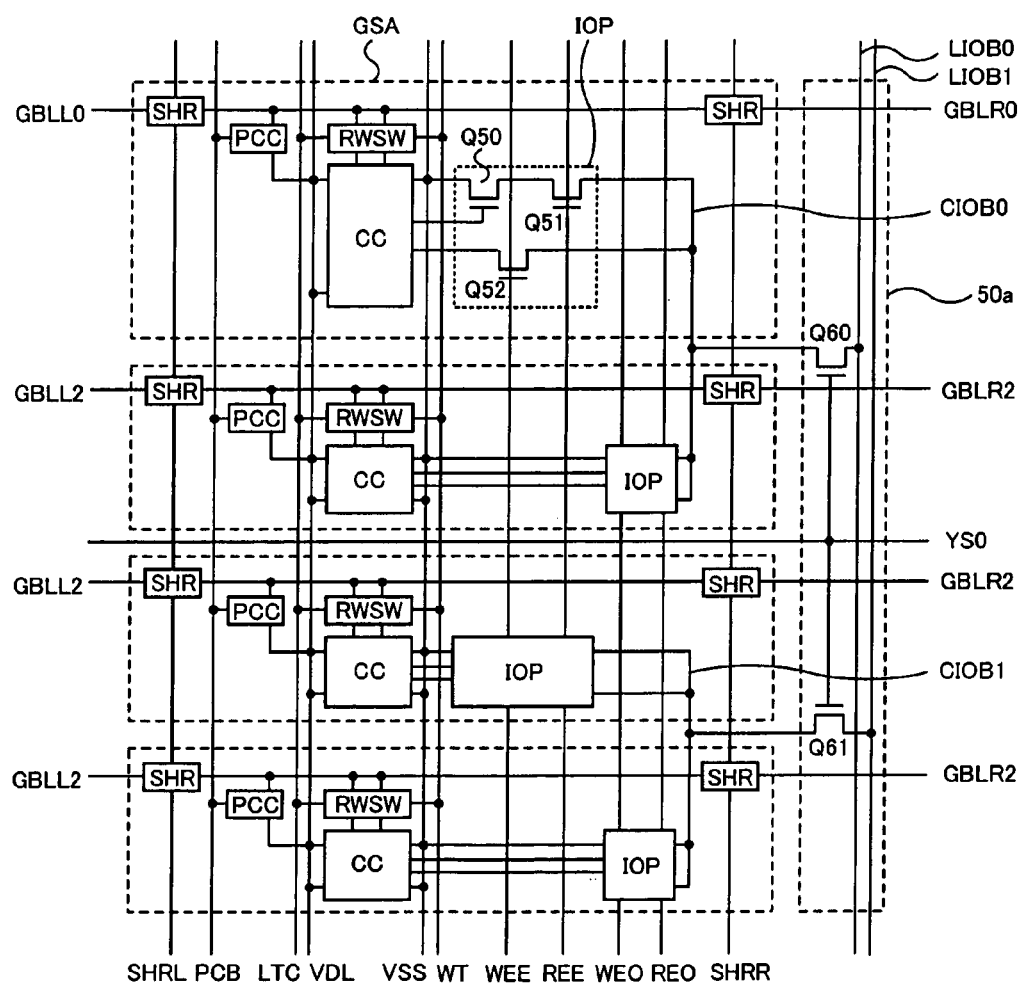
FIG. 15 is a diagram showing a circuit configuration example of a sense amplifier row of the third embodiment.
Figure 15A:
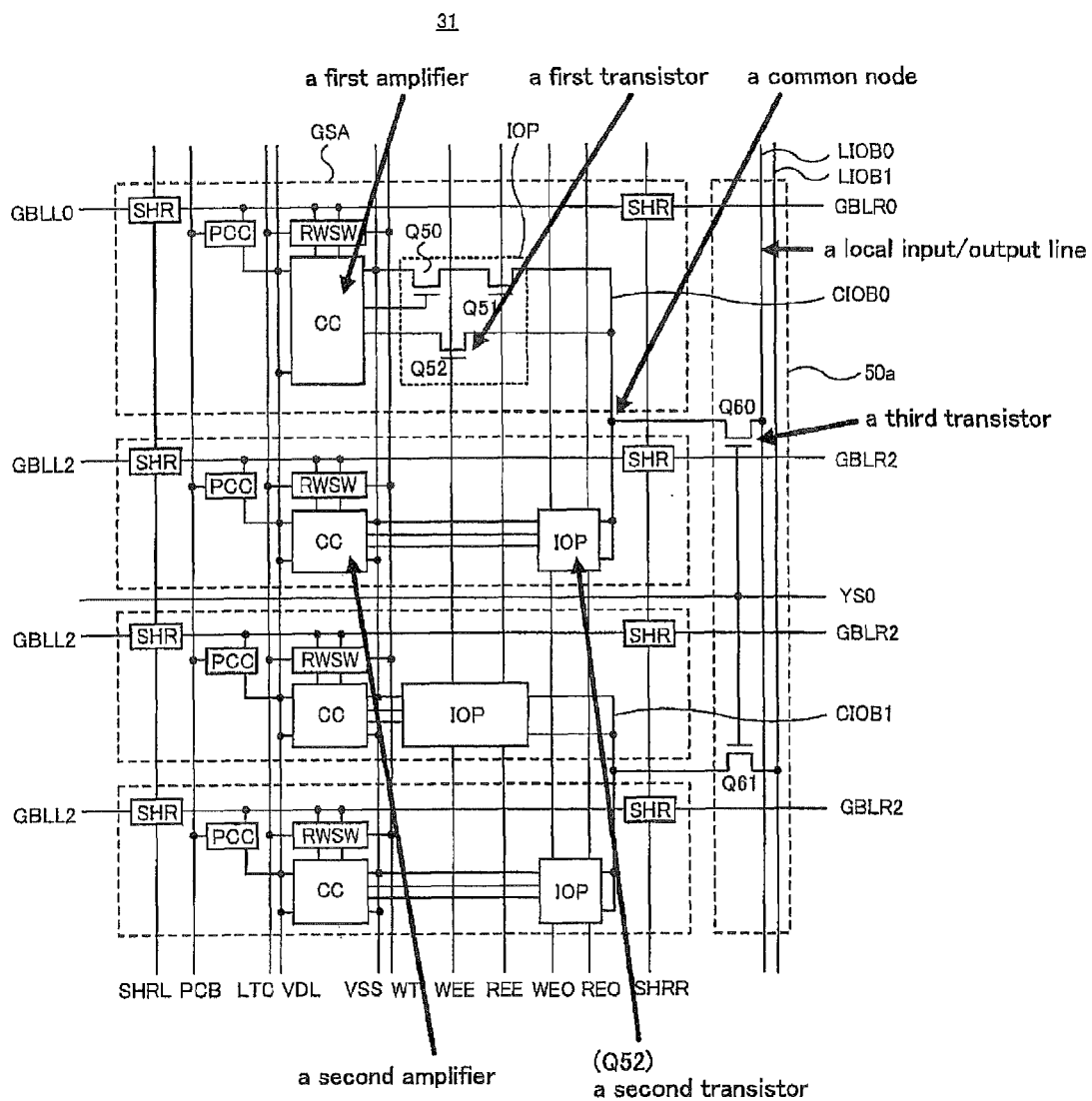

In the third embodiment, the invention is applied to the DRAM in which both the bit line structure and the sense amplifier structure are hierarchized (hierarchical bit line array) similarly as in the second embodiment, and however the configuration of the sense amplifier row 31 is modified in comparison with the second embodiment. In the third embodiment, configurations and operations of FIGS. 1 to 4 and 9 to 11 are common to those of the second embodiment, so description thereof will be omitted. FIG. 15 shows a circuit configuration example of the sense amplifier row 31 (FIG. 4) of the third embodiment. In the sense amplifier row 31 shown in FIG. 15, the shared switch SHR, the precharge circuit PCC, the read/write switch RWSW and the cross couple circuit CC included in the global sense amplifier GSA corresponding to the global bit line GBLLi (i=0 to 3) are the same as those in FIG. 12 of the second embodiment, and however the configuration of the input/output port IOP is different. Further, a configuration of a sub-column select circuit 50a disposed on the right side of the sense amplifier row 31 is also different from FIG. 12. Specifically, the input/output port IOP of FIG. 15 is composed of NMOS transistors Q50 and Q51 connected in series between the ground potential VSS and the input/output line CIOB0 (CIOB1) and an NMOS transistor Q52 connected between the node NB (FIG. 12) and the input/output line CIOB0 (CIOB1). The gate of the NMOS transistor Q50 is connected to the node NT (FIG. 12), the gate of the MMOS transistor Q51 is connected to a read control line REE (REO), and the gate of the NMOS transistor Q52 is connected to a write control line WEE (WEO).

Meanwhile, the sub-column select circuit 50a includes NMOS transistors Q60 and Q61 and is connected to one column select line YS0, the input/output lines CIOB0, CIOB1, and the local input/output lines LIOB0, LIOB, respectively. The NMOS transistor Q60 controls a connection between the input/output line CIOB0 and the local input/output line LIOB0, and the NMOS transistor Q61 controls a connection between the input/output line CIOB1 and the local input/output line LIOB1. Gates of the NMOS transistors Q60 and Q61 are connected to the column select line YS0. In addition, each of the input/output lines CIOB0 and CIOB1 is connected to the respective input/output ports IOP of two adjacent global sense amplifiers GSA. When comparing the configuration of FIG. 15 with that of FIG. 12 (FIG. 6), the input/output port IOP is not directly connected to the local input/output lines LIOB0, LIOB1 and is connected to them through the input/output lines CIOB0, CIOB1 and the NMOS transistors Q60, Q61, thereby simplifying the configuration of the sub-column select circuit 50a.

Figure 16:
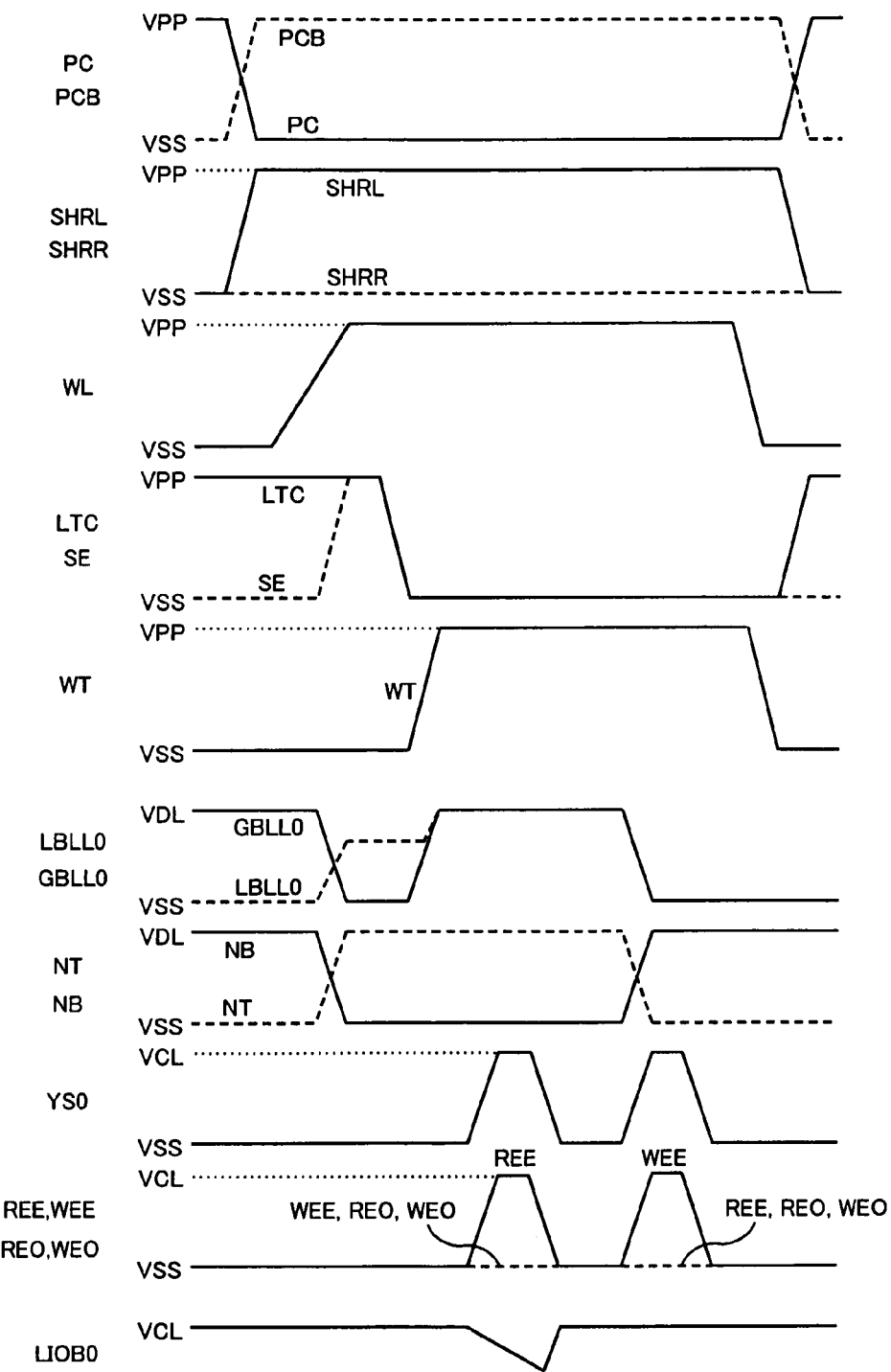
FIG. 16 is a diagram showing operation waveforms at various parts in the sense amplifier row of FIG. 15.

FIG. 16 shows operation waveforms at various parts in the sense amplifier row 31 of FIG. 15. Although most of the operation waveforms of FIG. 16 are common to those in FIG. 13 of the second embodiment, operation waveforms of the read control lines REE, REO and the write control lines WEE, WEO are shown in FIG. 16, instead of the sense amplifier select lines ZEB, ZOB and the sub-column select lines YSE0, YSO0 of FIG. 13. Among these, only the read control line REE is changed to "high" in a period when the column select line YS0 is initially changed to "high", and data of the global sense amplifier GSA is outputted to the local input/output lines LIOB0 and LIOB1 via the NMOS transistors Q51, Q60 and Q61. Thereafter, only the write control line WEE is changed to "high" in a period when the column select line YS0 is subsequently changed to "high", and data of the local input/output lines LIOB0 and LIOB1 is sent to the global sense amplifier GSA via the NMOS transistors Q60, Q61 and Q52.

Figure 17:
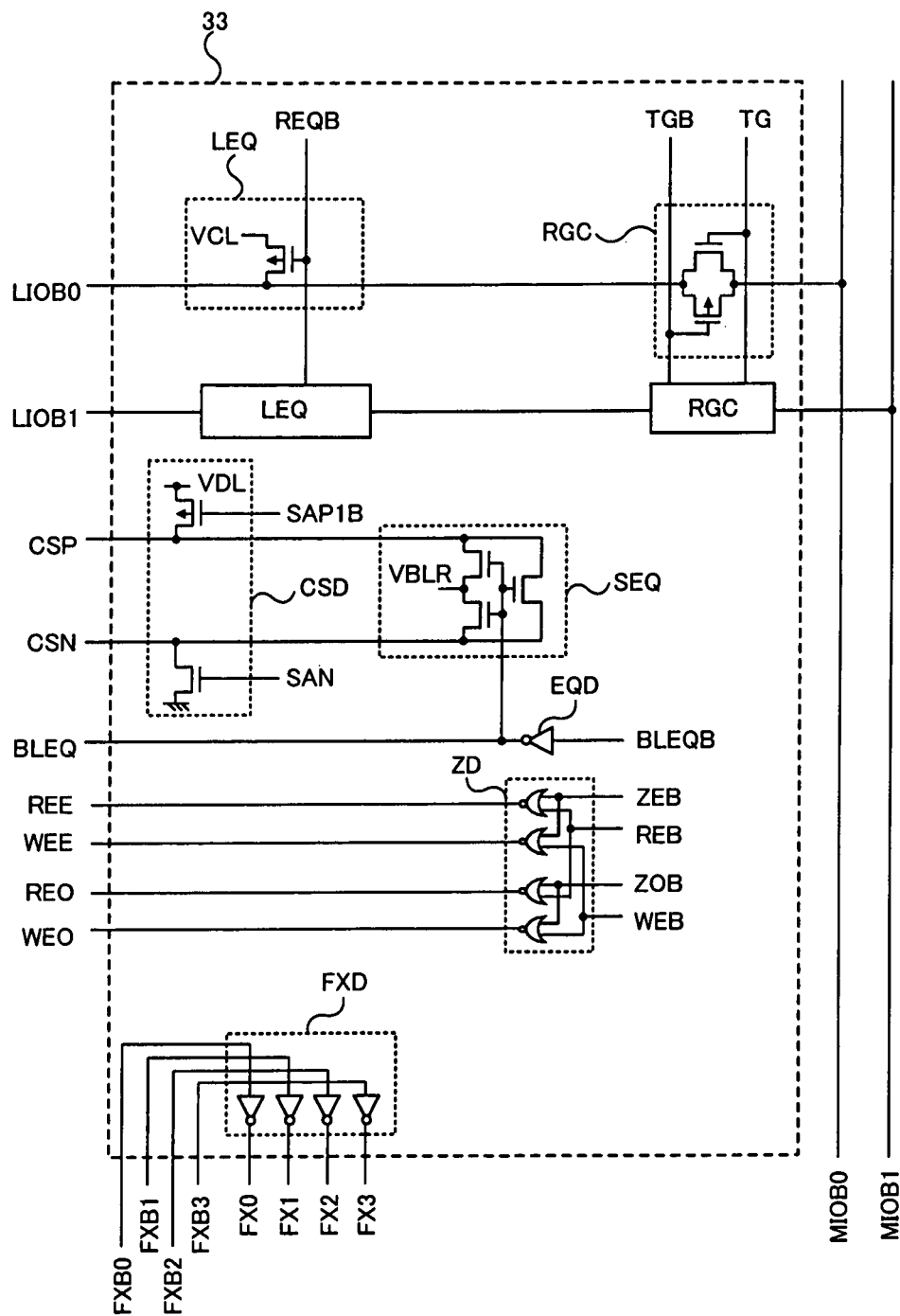
FIG. 17 is a diagram showing a circuit configuration example of a crosspoint section of the third embodiment.

Next, FIG. 17 shows a circuit configuration example of the crosspoint section 33 (FIG. 3) of the third embodiment. Although most of elements of the crosspoint section 33 shown in FIG. 17 are common to those in FIG. 14 of the second embodiment, the configuration of the Z driver ZD is different. Specifically, the Z driver ZD of FIG. 17 is composed of a NOR gate receiving the signal of the sense amplifier select line ZEB and the control signal REB and outputting the read control signal REE, a NOR gate receiving the signal of the sense amplifier select line ZEB and the control signal WEB and outputting the write control signal WEE, a NOR gate receiving the signal of the sense amplifier select line ZOB and the control signal REB and outputting the read control signal REO, and a NOR gate receiving the signal of the sense amplifier select line ZOB and the control signal WEB and outputting the write control signal WEO. Other elements are the same as in FIG. 14, so description thereof will be omitted.

[Fourth Embodiment]

In the fourth embodiment, the invention is applied to the DRAM in which both the bit line structure and the sense amplifier structure are not hierarchized (non-hierarchical bit line array). In the fourth embodiment, configurations and operations of FIGS. 1 to 3, 9 and 10 are common to those of the first embodiment, so description thereof will be omitted. However, since the non-hierarchical bit line structure is employed, the local bit lines LBL and the global bit lines GBL shown in the above figures are assumed to be replaced with bit lines BL.

Figure 18:
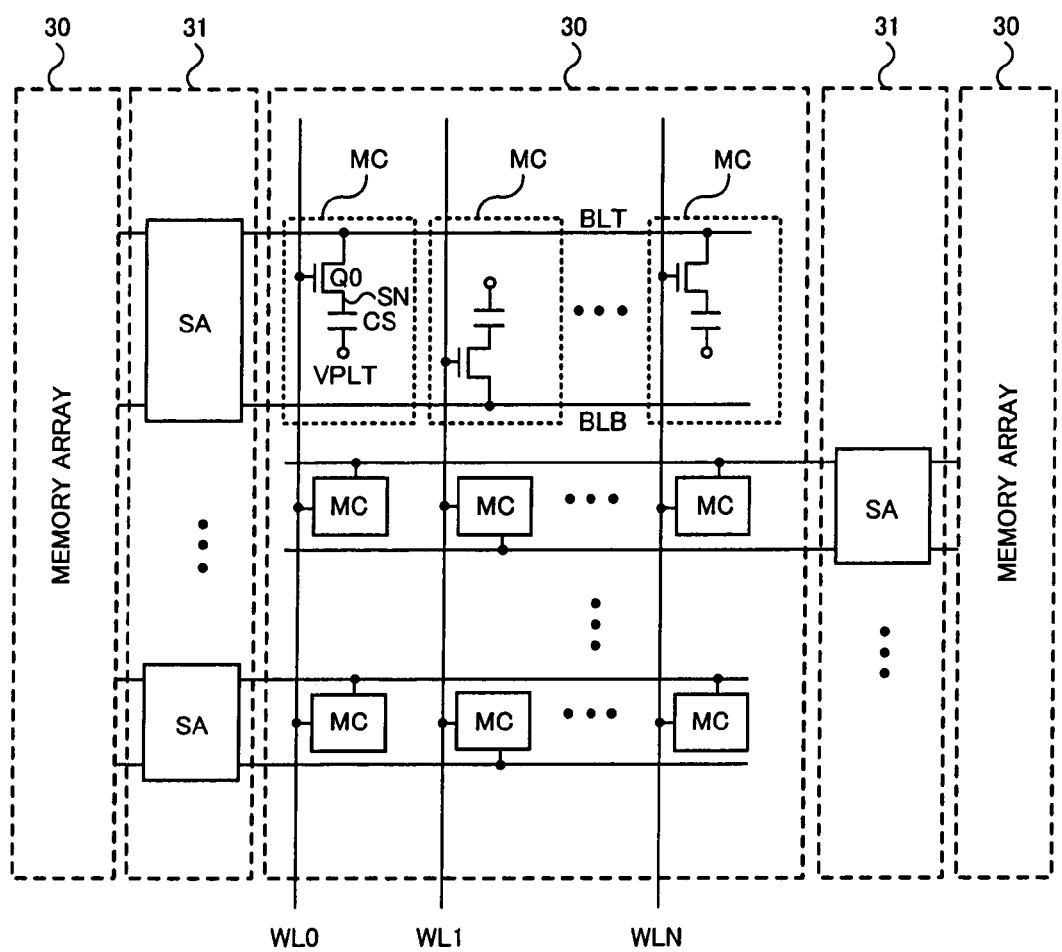
FIG. 18 is a diagram showing a first circuit configuration example of a memory array of a fourth embodiment.

FIG. 18 shows a first circuit configuration example of the memory array 30 (FIG. 2) of the fourth embodiment. The first circuit configuration example is assumed to have a folded bit line structure. In the memory array 30 of FIG. 18, a pair of adjacent bit lines BLT and BLB form a complementary pair, which is connected to the sense amplifier SA in one sense amplifier row 31. Respective pairs of bit lines BLT and BLB are alternately connected to sense amplifiers SA in sense amplifier rows 31 on the left and right sides in an order of arrangement. Each sense amplifier SA in the sense amplifier rows 31 is connected to two pairs of (four) bit lines BLT and BLB of the memory arrays 30 on both sides. Memory cells MC are formed at half of intersections of a plurality of pairs of bit lines BLT and BLB and N word lines WLj (j=0 to N). Each memory cell MC has the same structure as that of the first to third embodiments. Further, the sense amplifier row 31 has the same configuration as that of any one of the first to third embodiments (FIGS. 6, 12 and 15).

Figure 19:
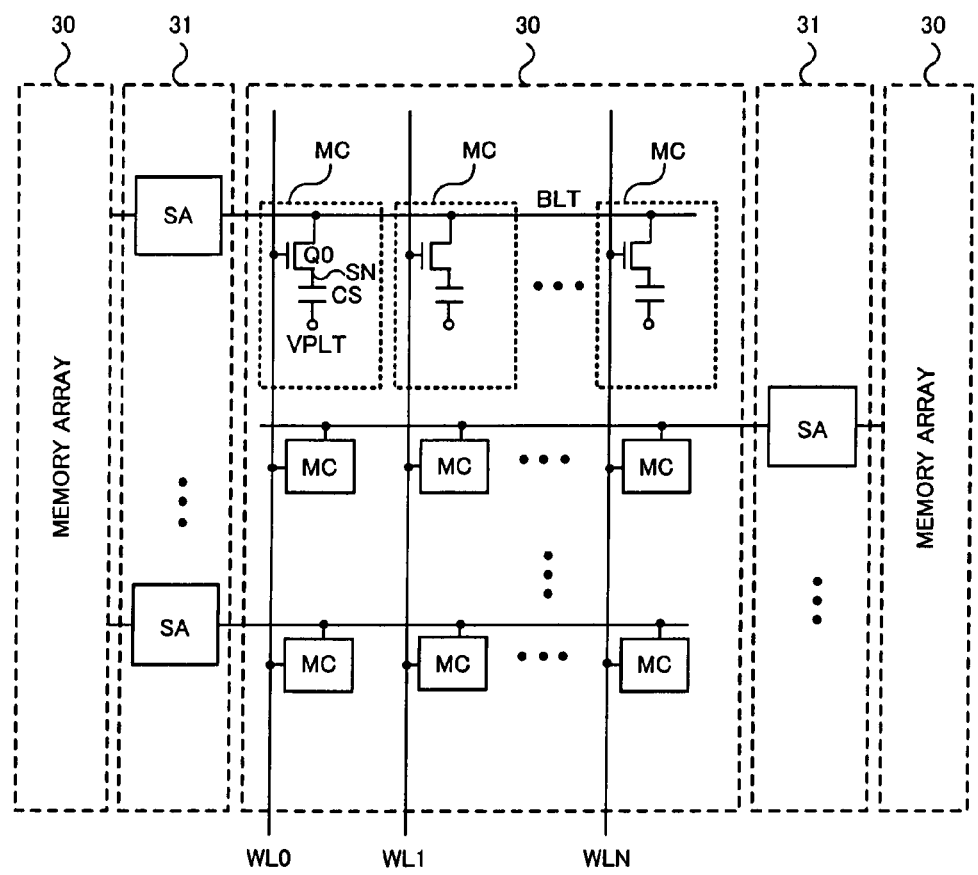
FIG. 19 is a diagram showing a second circuit configuration example of a memory array of the fourth embodiment.

FIG. 19 shows a second circuit configuration example of the memory array 30 of the fourth embodiment. The second circuit configuration example is assumed to have an open bit line structure. In the memory array 30 of FIG. 19, respective bit lines BLT are alternately connected to sense amplifiers SA in sense amplifier rows 31 on the left and right sides in an order of arrangement. Each sense amplifier SA in the sense amplifier rows 31 is connected to two bit lines BLT of the memory arrays 30 on both sides. Memory cells MC are formed at all intersections of a plurality of bit lines BLT and N word lines WLj (j=0 to N). Each memory cell MC has the same structure as that of the first to third embodiments. Further, the sense amplifier row 31 has the same configuration as that of any one of the first to third embodiments (FIGS. 6, 12 and 15).

[Column Relief Method]

Figure 20A:
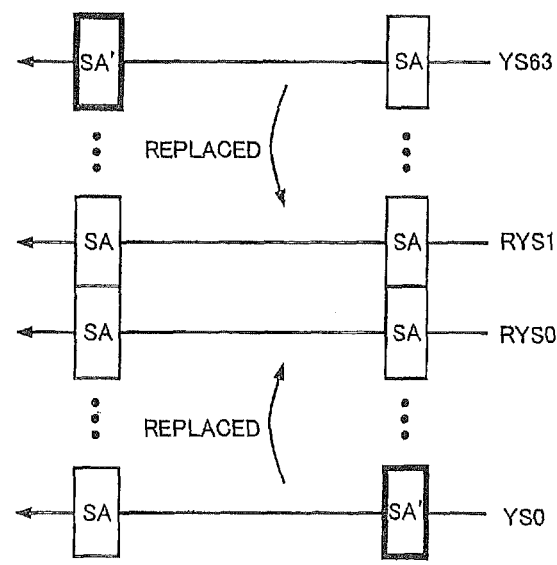
FIG. 20 is a diagram explaining a conventional general column relief method.

In the following, an effect of applying a column relief method to the DRAM of the first to fourth embodiments will be described. First, a conventional general column relief method will be described using FIGS. 20A and 20B. FIG. 20A schematically shows an outline of the conventional column relief method. In FIG. 20A, 64 column select line YS (YS0 to YS63) and two redundancy column select lines RYS (RYS0 and RYS1) are arranged. Each of the column select lines YS and the redundancy column select lines RYS is connected to sense amplifiers SA on both sides. Assuming that a defective sense amplifier SA' does not exist on two redundancy column select lines MS in the example of FIG. 20A, one or two column select lines YS on which the defective sense amplifier SA' exists can be relieved. For example, as shown in FIG. 20A, a situation in which one defective sense amplifier SA' exists on each of two column select lines YS0 and YS63 (two defective sense amplifiers SA' in total) is assumed. In this situation, the column select line YS0 is replaced with the redundancy column select line RYS0 when receiving a Y address for selecting the column select line YS0, and the column select line YS63 is replaced with the redundancy column select line RYS1 when receiving a Y address for selecting the column select line YS63. By this control, two defective sense amplifiers SA' can be relieved.

Figure 20B:
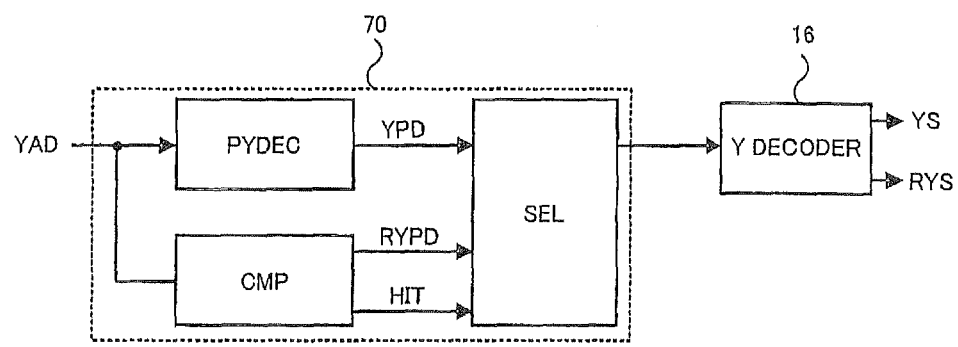

FIG. 20B shows a configuration example of a relief circuit 70 achieving the conventional column relief method described in FIG. 20A. The relief circuit 70 of FIG. 20B includes a Y predecoder PYDEC, a comparison circuit CMP and a select circuit SEL. The Y predecoder PYDEC predecodes an input Y address YAD and generates a Y predecode signal YPD. The comparison circuit CMP determines whether the Y address YAD needs to be relieved or not, in conjunction with the operation of the Y predecoder PYDEC, and generates a redundancy Y predecode signal RYPD and a hit signal HIT. The select circuit SEL determines whether or not the Y address YAD is an address to be relieved based on the hit signal HIT, selects the Y predecode signal YPD when determining the address that needs not to be relieved, selects the redundancy Y predecode signal RYPD when determining the address that needs to be relieved, and outputs the selected signal to the Y decoder 16. The Y decoder 16 selects the column select line YS or the redundancy column select line RYS in response to the output signal of the select circuit SEL.

If the configuration shown in FIG. 20B is employed, the column relief method described in FIG. 20A can be achieved.

Figure 21:
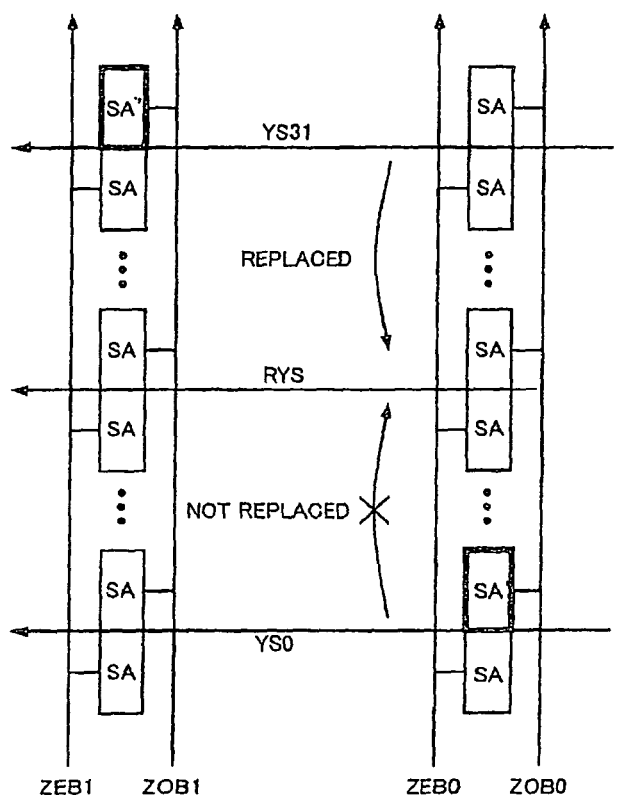
FIG. 21 is a diagram schematically shows a case where the conventional column relief method is applied to a column selection method described in the embodiments.

FIG. 21 schematically shows a case where the conventional column relief method is applied to the column selection method described in the embodiments. In FIG. 21, 32 column select lines YS (YS0 to YS31), the number of which is half that in FIG. 20A, one redundancy column select line RYS and four sense amplifier select lines ZEB0, ZEB1, ZOB0 and ZOB1 are arranged. As described previously, the number of column select lines YS is reduced to half when applying the invention, and therefore the number of redundancy column select lines RYS is also reduced to half (one). Thus, if the conventional column relief method is applied to the embodiments, only one column select line YS can be relieved. For example, as shown in FIG. 21, a situation in which there exist a defective sense amplifier SA' corresponding to the column select line YS0 and the sense amplifier select line ZOB0, and a defective sense amplifier SA' corresponding to the column select line YS31 and the sense amplifier select line ZOB1. In this situation, when the defective sense amplifier SA' on one column select line YS31 is relieved by replacing it with the redundancy column select line RYS, the defective sense amplifier SA' on the other column select line YS0 cannot be relieved. Therefore, the column relief method of FIG. 21 has a problem that relief efficiency is reduced to half in comparison with the column relief method of FIG. 20A.

Figure 22:
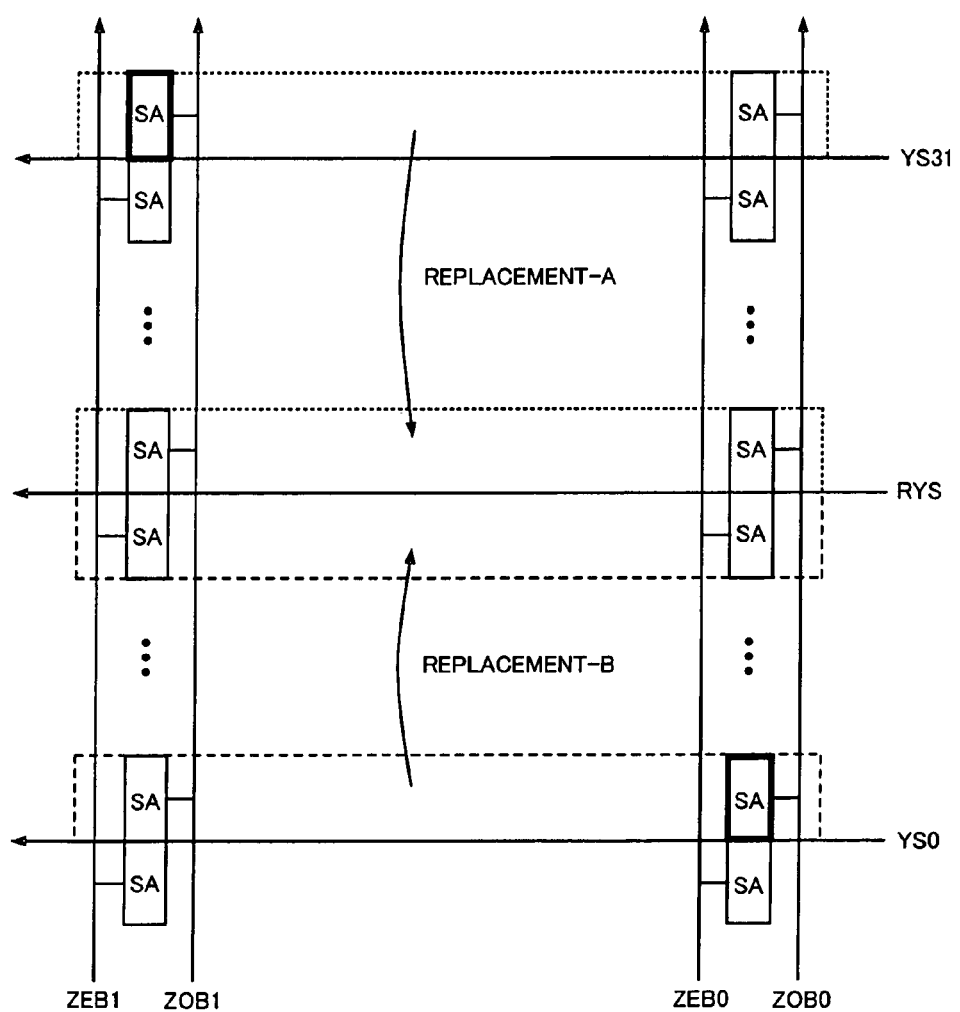
FIG. 22 is a diagram schematically shows a column relief method of the invention applied to the embodiments.

FIG. 22 schematically shows the column relief method of the invention applied to the embodiments in order to solve the above problem. In FIG. 22, 32 column select lines YS (YS0 to YS31), one redundancy column select line RYS, and four sense amplifier select lines ZEB0, ZEB1, ZOB0 and ZOB1 are arranged. As shown in FIG. 22, for example, a situation where two defective sense amplifiers SA' exist at the same positions as in FIG. 21. The column relief method of FIG. 22 is controlled so that when receiving the Y and Z addresses for selecting the column select line YS31 and the sense amplifier select line ZOB0 (ZOB1), they are replaced with the redundancy column select line RYS and the sense amplifier select line ZOB0 (ZOB1) (replacement-A). Further, when receiving the Y and Z addresses for selecting the column select line YS0 and the sense amplifier select line ZOB0 (ZOB1), they are replaced with the redundancy column select line RYS and the sense amplifier select line ZEB0 (ZEB1) (replacement-B). By employing such a column relief method, it is possible to relieve both the defective sense amplifier SA' selected by the column select line YS31 and the sense amplifier select line ZOB1, and the defective sense amplifier SA' selected by the column select line YS0 and the sense amplifier select line ZOB0. As a result, the problem of FIG. 21 regarding the relief efficiency in the column relief method of FIG. 22 is solved, and at least the same relief efficiency as the conventional column relief method of FIG. 20A can be obtained.

Figure 23:
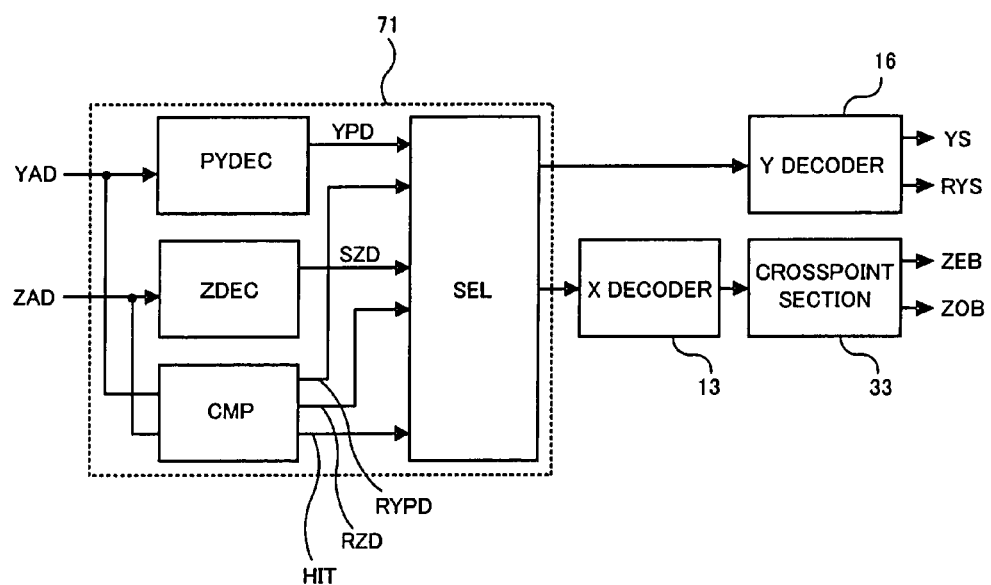
FIG. 23 is a diagram showing a configuration example of a relief circuit achieving the column relief method of FIG. 22.

FIG. 23 shows a configuration example of the relief circuit 71 achieving the column relief method described in FIG. 22. The relief circuit 71 of FIG. 23 includes a Y predecoder PYDEC, a Z decoder ZDEC, a comparison circuit CMP and a select circuit SEL. The Y predecoder PYDEC predecodes an input Y address YAD and generates a Y predecode signal YPD. The Z decoder ZDEC decodes an input Z address ZAD and generates a Z decode signal SZD. The comparison circuit CMP determines whether the Y address YAD and the Z address ZAD need to be relieved or not, in conjunction with the operations of the Y predecoder PYDEC and the Z decoder ZDEC, and generates a redundancy Y predecode signal RYPD, a redundancy Z decode signal RZD and a hit signal HIT. The select circuit SEL determines whether or not the Y address YAD and the Z address ZAD are addresses to be relieved based on the hit signal HIT, selects the Y predecode signal YPD and the Z decode signal SZD when determining the addresses that need not to be relieved, selects the redundancy Y predecode signal RYPD and the redundancy Z decode signal RZD when determining the addresses that need to be relieved, and outputs the selected signals to the Y decoder 16 (FIG. 1). The column select line YS or the redundancy column select line RYS is selected by the Y decoder 16, and the sense amplifier select line ZEB or ZOB is selected by the X decoders 13 (FIG. 1) and the Z driver ZD in the crosspoint section 33. If the configuration of the relief circuit 71 of FIG. 23 is employed in the embodiments, the column relief method described in FIG. 22 can be achieved.

[Layout Method of Wiring Layers]

In the following, layout and its effect of wiring layers applied to the DRAM of the first to fourth embodiments will described. FIG. 24 shows an example of a general assignment in which respective lines are assigned to wiring layers M0 to M3 over the memory array 30 in relation to the hierarchical bit line structure (the first to third embodiments) and the non-hierarchical bit line structure (the fourth embodiment). Here, in a multilayer structure of the DRAM, the wiring layers M0 to M3 are formed in an order of M0, M1, M2 and M3 from the lower layer. First, in the DRAM of the non-hierarchical bit line structure, bit lines BL are formed on the wiring layer M0, main word lines MWLB are formed on the wiring layer M1, column select lines YS are formed on the wiring layer M2, and power supply lines PL are formed on the wiring layer M3. On the other hand, in the DRAM of the hierarchical bit line structure, local bit lines LBL are formed on the wiring layer M0, global bit lines GBL are formed on the wiring layer M1, main word lines MWLB are formed on the wiring layer M2, and column select lines YS and power supply lines PL are formed on the wiring layer M3. In addition, FIG. 24 indicates lines on the wiring layers M0 to M3 over the memory array 30, and therefore the power supply lines PL and the like may be formed on wiring layers other than the wiring layer M3 over other regions. Since the layout method of the power supply lines PL is particularly problematic in FIG. 24, it will be described with reference to FIGS. 25 to 29.

Figure 25:
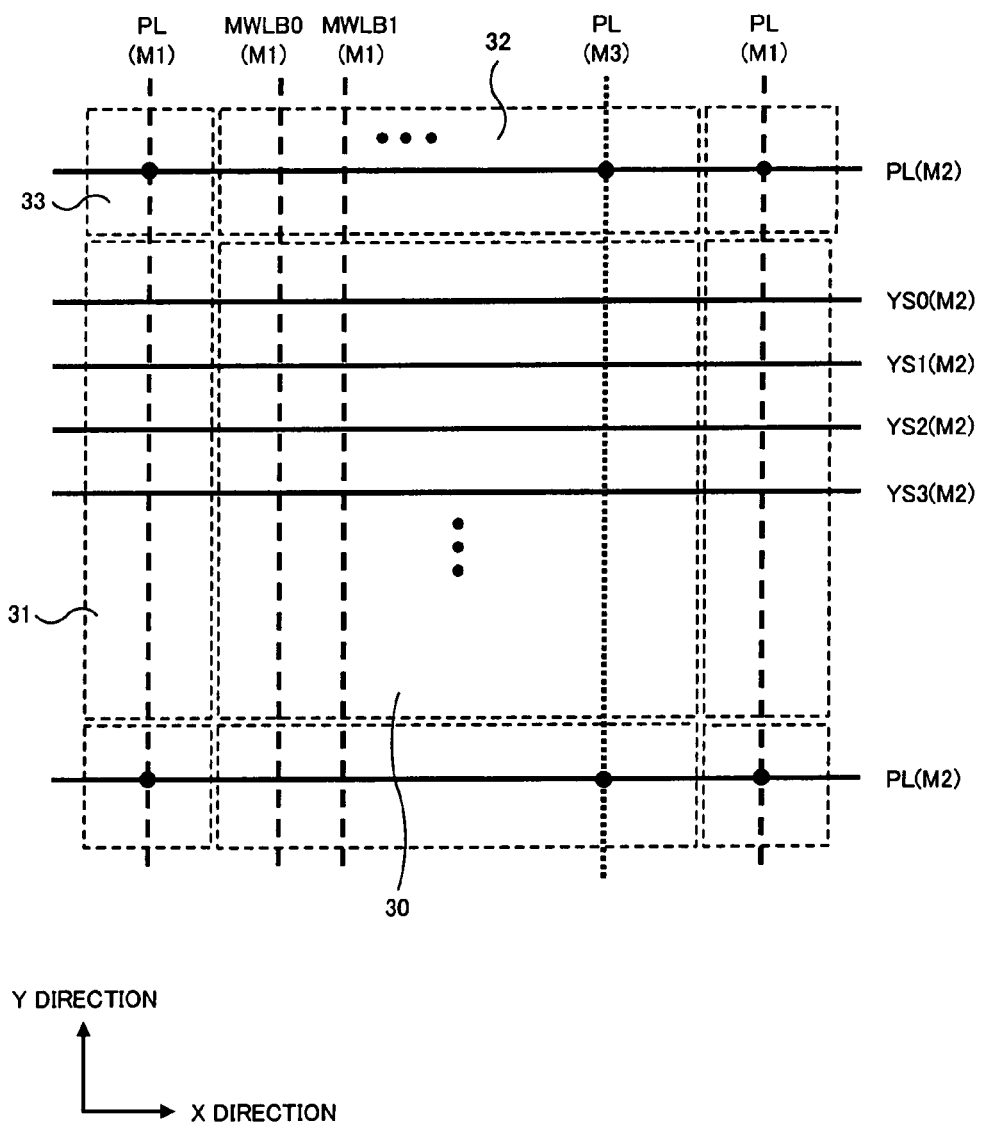
FIG. 25 is a diagram showing a layout example of power supply lines in the DRAM of a general non-hierarchical bit line structure.

FIGS. 25 to 29 are diagrams schematically showing the power supply lines PL and other lines arranged over the memory array 10 and its peripheral region, in which an X direction (first direction) and a Y direction (second direction) are indicated for the convenience of description. FIG. 25 shows a layout example of the power supply lines PL in the DRAM of the general non-hierarchical bit line structure. The main word line MWLB extending in the Y direction are arranged on the wiring layer M1, and the column select line YS extending in the X direction are arranged on the wiring layer M2. Further, the power supply lines PL extending in the Y direction are arranged on the wiring layer M1 over the sense amplifier row 31, the power supply lines PL extending in the X direction are arranged on the wiring layer M2 over the sub-word driver row 32, and the power supply lines PL extending in the Y direction are arranged on the wiring layer M3. In this manner, the wiring layers M1 and M2 are occupied by the main word lines MWLB and the column select lines YS over the memory array 30, and therefore the wiring layer M3 is used for the power supply lines PL.

Figure 26:
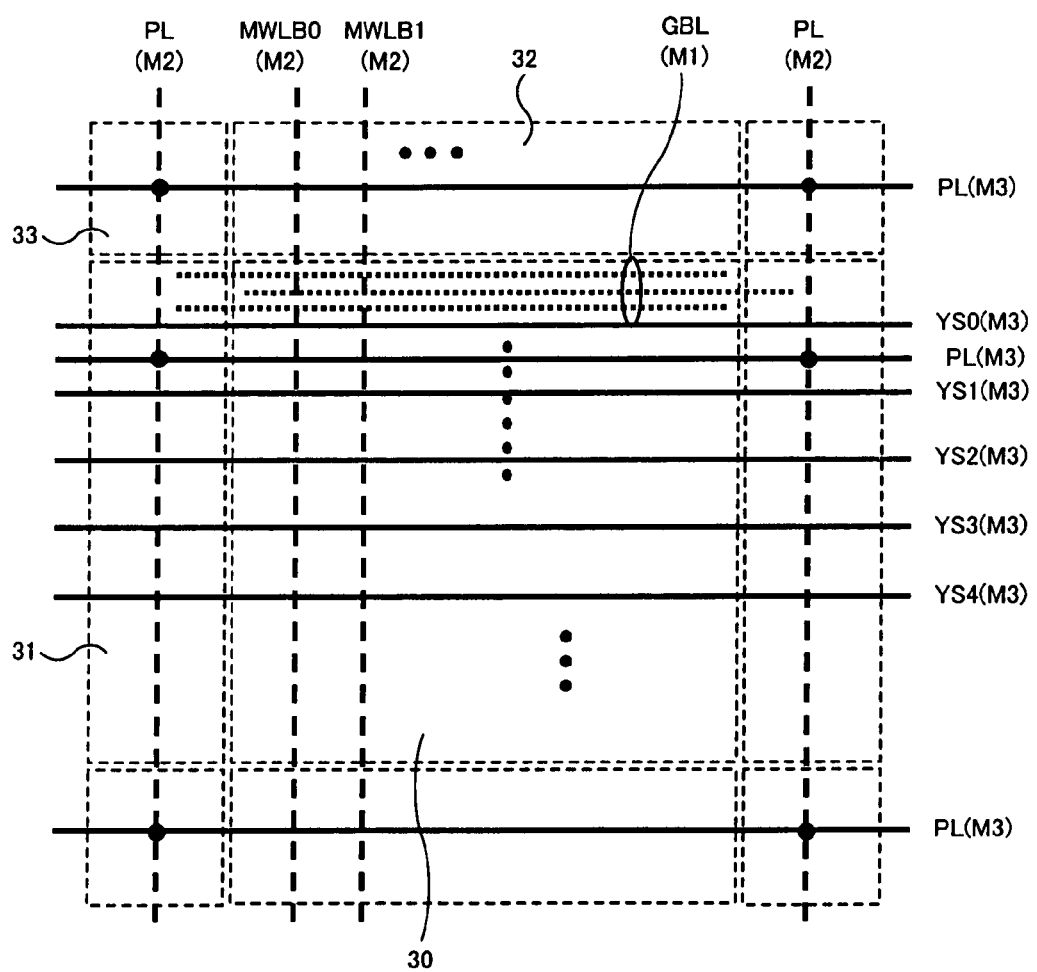
FIG. 26 is a diagram showing a layout example of the power supply lines in the DRAM of a general hierarchical bit line structure.

FIG. 26 shows a layout example of the power supply lines PL in the DRAM of the general hierarchical bit line structure. The global bit lines GBL extending in the X direction are arranged on the wiring layer M1, and therefore the main word lines MWLB and the column select lines YS are arranged on the wiring layers M2 and M3, which are shifted upward by one layer in comparison with FIG. 25. Similarly, the power supply lines PL on the wiring layers M1 and M2 of FIG. 25 are arranged on the wiring layers M2 and M3, which are shifted upward by one layer. Meanwhile, in order to arrange the power supply lines PL on the wiring layer M3 of FIG. 25 without providing a wiring layer above the wiring layer M3, it is necessary to reduce linewidth of each column select lines YS on the wiring layer M3 and to arrange the power supply lines PL parallel to the column select lines YS in an empty space. Therefore, as shown in FIG. 26, when the hierarchical bit line structure is employed, not only the linewidth of each power supply line PL is reduced, but also the linewidth of each column select lines YS is reduced, in comparison with the non-hierarchical bit line structure, thereby increasing the resistive component of each of the column select lines YS and the power supply lines PL.

Figure 27:
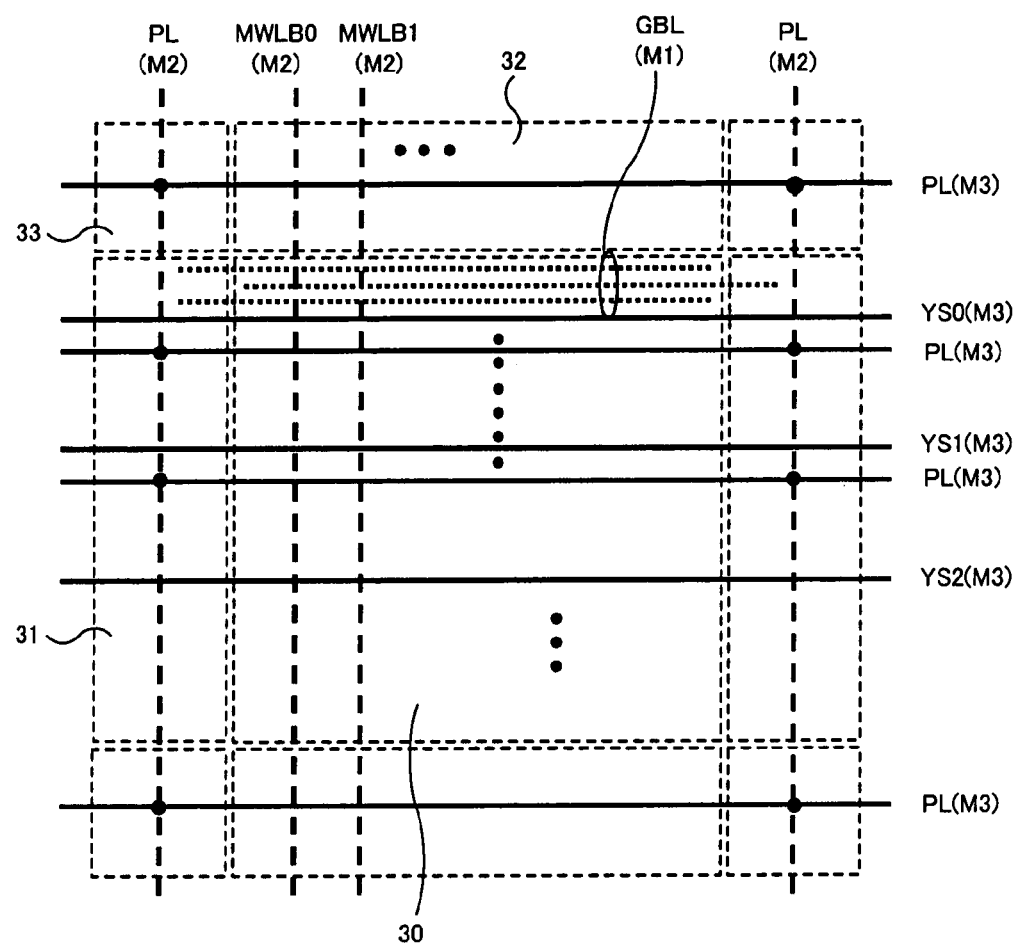
FIG. 27 is a diagram showing a layout example of the power supply lines in the DRAM of the hierarchical bit line structure to which the column selection method of the invention is applied.
Figure 27A:
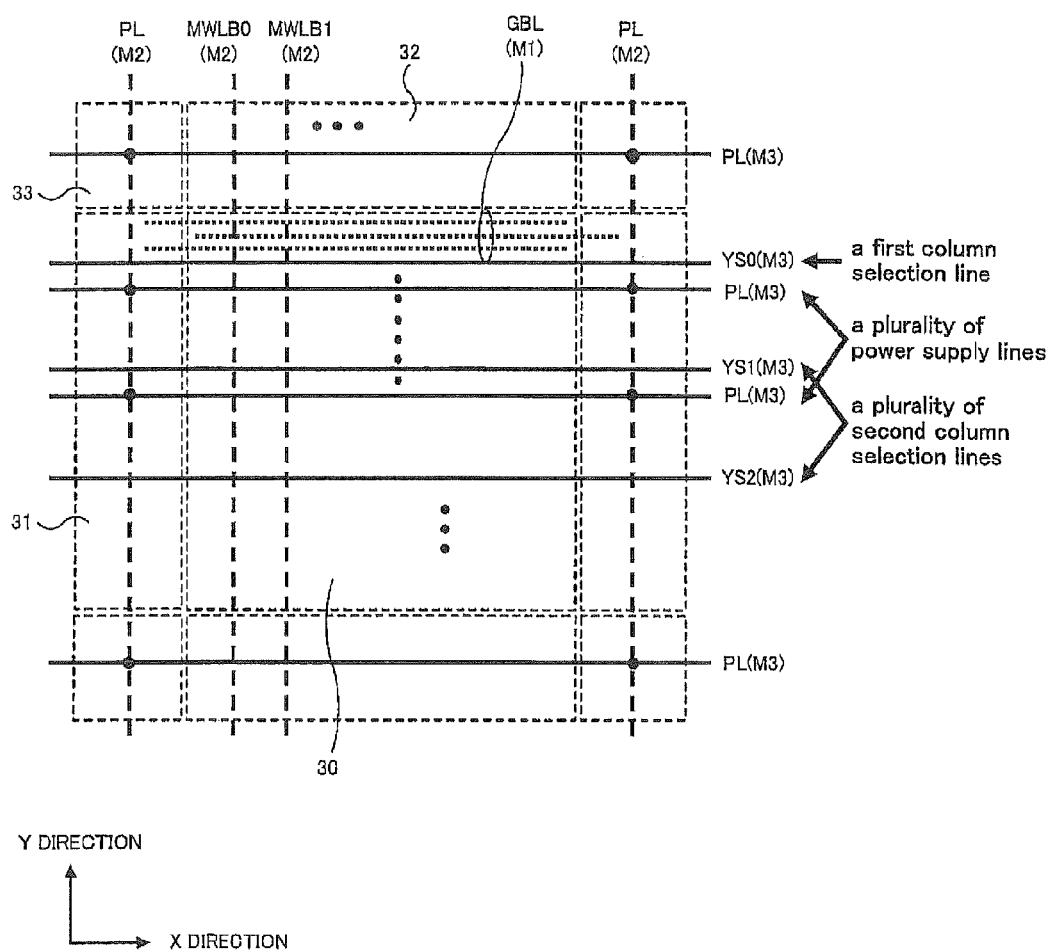

Next, FIG. 27 shows a layout example of the power supply lines PL in the DRAM of the hierarchical bit line structure to which the column selection method of the invention is applied. In FIG. 27, a difference from FIG. 26 is that sufficient empty spaces for arranging the power supply lines PL can be obtained in the wiring layer M3 since the number of column select lines YS can be reduced to half, as described in the above embodiments. As a result, it is possible to avoid the above-mentioned reduction in linewidth of each of the column select lines YS and the power supply lines PL so as to reduce the resistive component.

Figure 28:
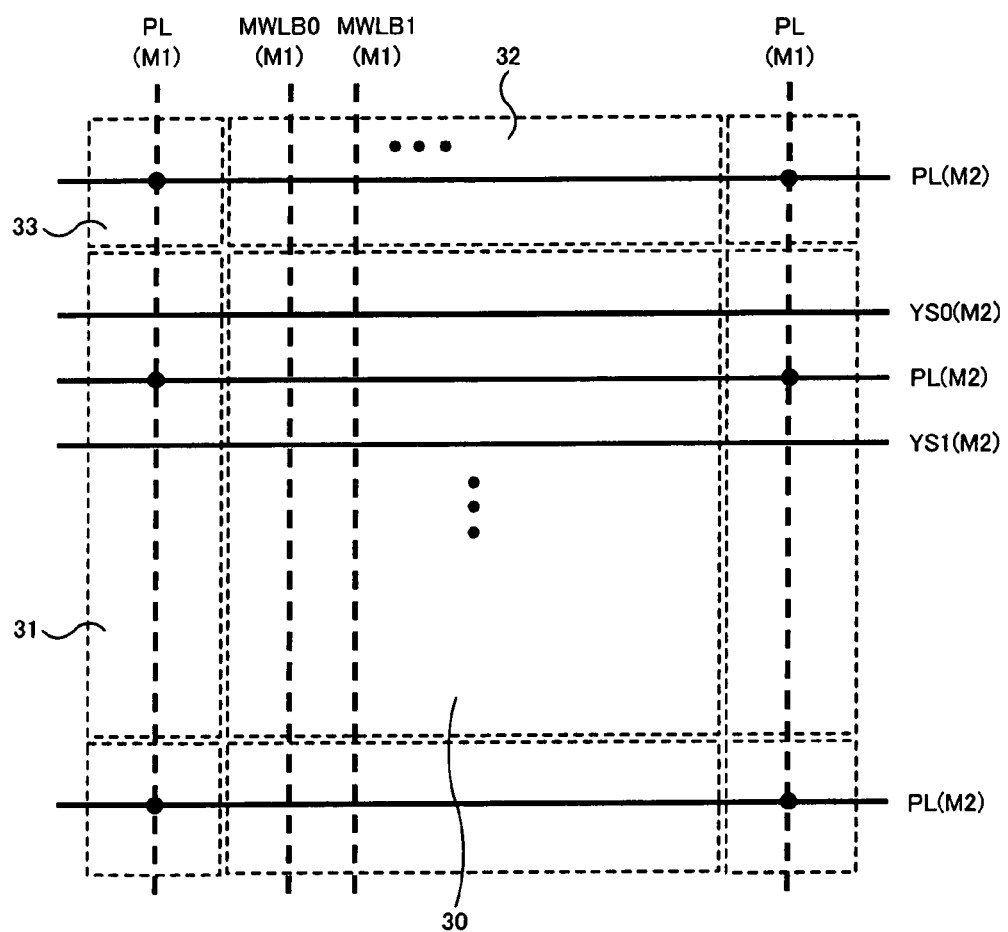
FIG. 28 is a diagram showing a first layout example of the power supply lines in the DRAM of the non-hierarchical bit line structure to which the column selection method of the invention is applied.

Meanwhile, FIG. 28 shows a first layout example of the power supply lines PL in the DRAM of the non-hierarchical bit line structure to which the column selection method of the invention is applied. In FIG. 28, a difference from FIG. 25 is that the wiring layer M2 over the memory array 30 is not occupied by the column select lines YS to obtain empty spaces for arranging the power supply lines PL (the wiring layer M3 in FIG. 25) since the number of column select lines YS can be reduced to half, as described in the above embodiments. As a result, the wiring layer M3 in FIG. 25 is not necessary and thus manufacturing cost of the DRAM can be reduced.

Figure 29:
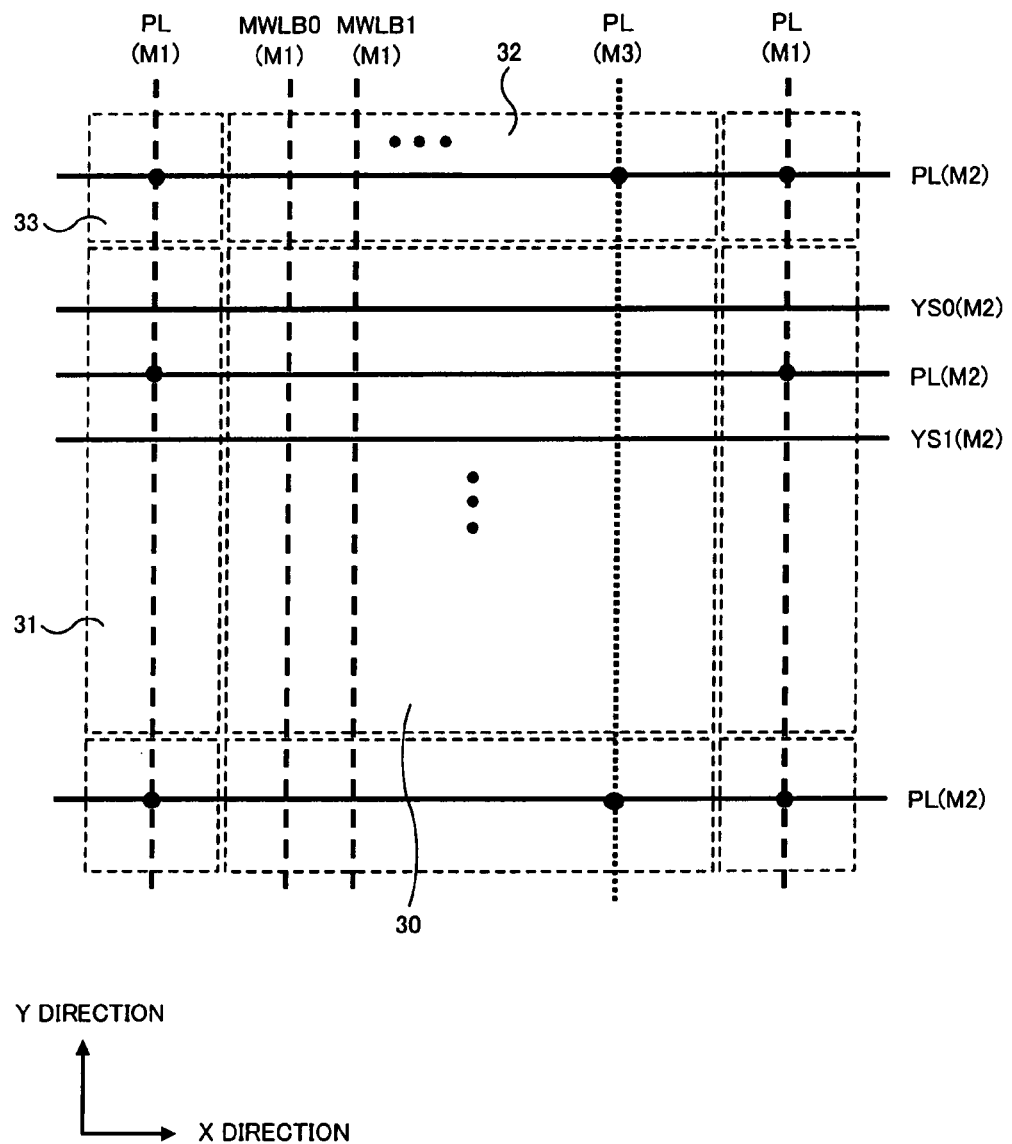
FIG. 29 is a diagram showing a second layout example of the power supply lines in the DRAM of the non-hierarchical bit line structure to which the column selection method of the invention is applied.

Further, FIG. 29 shows a second layout example of the power supply lines PL in the DRAM of the non-hierarchical bit line structure to which the column selection method of the invention is applied. The feature in FIG. 29 is that the wiring layer M3 that is unnecessary in FIG. 28 is formed and the power supply lines PL extending in the Y direction are further arranged on the wiring layer M3. As a result, the resistive component of the power supply lines PL can be reduced by further adding the power supply lines PL. Thereby, the power supply noise that is the problem arising from the miniaturization of the DRAM can be suppressed. Generally, a semiconductor device such as DRAM tends to use lower voltages, and thereby influence of the power supply noise becomes significant and causes performance deterioration of the semiconductor device. However, the problem caused by the power supply noise can be prevented by employing the second layout example shown in FIG. 29.

In the foregoing, although the contents of the invention have been specifically described based on the embodiments, the invention is not limited the above-described embodiments, and can variously be modified without departing the essentials of the invention. For example, the above embodiments have described the circuit configuration and the operations of circuits included in the memory array 30, the sense amplifier row 31, the sub-word driver row 32 and the cross-point section 33 of FIG. 2 in the embodiments. However, the invention is not limited to them and can be widely applied to semiconductor devices having various configurations and operations. Further, the invention is not limited to the DRAM and can be applied to various semiconductor devices including CPU (Central Processing Unit), MCU (Micro Control Unit), DSP (Digital Signal Processor), ASIC (Application Specific Integrated Circuit), ASSP (Application Specific Standard Product) and the like.

The invention claimed is:

1. A semiconductor device comprising:
   first and second memory cells;
   a first bit line connected to the first memory cell;
   a second bit line connected to the second memory cell;
   a first amplifier connected to the first bit line;
   a second amplifier connected to the second bit line;
   a local input/output line;
   a first transistor coupled to the first amplifier at a first electrode thereof and the local input/output line at a second electrode thereof;
   a second transistor coupled to the second amplifier at a third electrode thereof and the local input/output line at a fourth electrode thereof;
   a first column selection line;
   a third transistor coupled between the first column selection line and a gate electrode of the first transistor, the third transistor connecting, when rendered conductive in response to a first selection signal, the first column selection line with the gate electrode of the first transistor; and
   a fourth transistor coupled between the first column selection line and a gate electrode of the second transistor, the fourth transistor connecting, when rendered conductive in response to a second selection signal, the first column selection line with the gate electrode of the second transistor.

2. The semiconductor device according to claim 1, wherein when a column selection signal is activated, one of the first and second selection signals is activated, and one of the third and fourth transistors that receives an activated one of the first and second selection signals is rendered conductive to connect the first column selection line with one of the first and second transistors.

3. The semiconductor device according to claim 1, further comprising a hierarchical bit line structure including a plurality of local bit lines and a plurality of global bit lines, wherein each of the global bit lines is connected with corresponding one or ones of the local bit lines, the global bit lines include first and second global bit lines serving respectively as the first and the second bit lines, and the first global bit line is arranged adjacent to the second global bit line without an intervention of any other global bit lines between the first and second global bit lines.

4. The semiconductor device according to claim 3, further comprising a plurality of sense amplifiers, wherein each of the global bit lines is coupled to corresponding one of the sense amplifiers, and each of the first and second amplifiers is included in an associated one of the sense amplifiers.

5. The semiconductor device according to claim 3, further comprising a hierarchical amplifier structure including a plurality of local sense amplifiers and a plurality of global sense amplifiers, wherein each of the global sense amplifiers is connected with corresponding one or ones of the local sense amplifiers, the global sense amplifiers includes first and second global sense amplifiers serving respectively as the first and second amplifiers.

6. The semiconductor device according to claim 1, wherein each of the first and second amplifiers is a single-ended amplifier.

7. The semiconductor device according to claim 1, further comprising first and second selection signal lines that transfers respectively first and second selection signals extend in a first direction, and wherein the first and second bit lines extend in a second direction crossing the first direction, the first and second sense amplifiers are aligned in a first direction, and the first column selection line extends in the second direction.

8. The semiconductor device according to claim 1, further comprising a plurality of second column selection lines, a plurality of power supply lines and a first wiring layer, wherein each of the first and second column selection lines and the power supply lines is provided as the first wiring layer.

9. A semiconductor device comprising:

first and second memory cells;

a first bit line connected to the first memory cell;

a second bit line connected to the second memory cell;

a first amplifier connected to the first bit line;

a second amplifier connected to the second bit line;

a common node;

a first transistor coupled to the first amplifier at a first electrode thereof and the common node at a second electrode thereof, the first transistor controlling a connection between the first amplifier and the common node in response to a first selection signal;

a second transistor coupled to the second amplifier at a third electrode thereof and the common node at a fourth electrode thereof, the second transistor controlling a connection between the second amplifier and the common node in response to a second selection signal;

a local input/output line;

a column selection line transferring a column selection signal; and a third transistor controlling a connection between the common node and the local input/output line in response to the column selection signal.

10. The semiconductor device according to claim 9, wherein the device has a hierarchical bit line structure including a plurality of local bit lines and a plurality of global bit lines and has a hierarchical sense amplifier structure including a plurality of local sense amplifiers and a plurality of global sense amplifiers, and each of the first and second bit lines is a corresponding one of the global bit lines, and each of the first and second sense amplifiers is included in a corresponding one of the global sense amplifiers.

* * * * *